United States Patent
Jung et al.

(10) Patent No.: US 9,685,609 B2
(45) Date of Patent: Jun. 20, 2017

(54) VARIABLE RESISTANCE MEMORY DEVICES AND METHODS OF MANUFACTURING THE SAME

(71) Applicants: Seung-Jae Jung, Suwon-si (KR); Youn-Seon Kang, Yoigin-si (KR)

(72) Inventors: Seung-Jae Jung, Suwon-si (KR); Youn-Seon Kang, Yoigin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/963,947

(22) Filed: Dec. 9, 2015

(65) Prior Publication Data

US 2016/0181321 A1 Jun. 23, 2016

(30) Foreign Application Priority Data

Dec. 22, 2014 (KR) .................. 10-2014-0185781

(51) Int. Cl.
*H01L 27/24* (2006.01)
*H01L 45/00* (2006.01)

(52) U.S. Cl.
CPC ........ *H01L 45/147* (2013.01); *H01L 27/2409* (2013.01); *H01L 27/2481* (2013.01);
(Continued)

(58) Field of Classification Search
CPC ..... H01L 45/147; H01L 45/141; H01L 45/06; H01L 27/2481; H01L 45/08;
(Continued)

(56) References Cited

U.S. PATENT DOCUMENTS 7,589,344 B2 9/2009 Sato
7,615,769 B2 11/2009 Kim
(Continued)

FOREIGN PATENT DOCUMENTS

KR 2010-0032583 A 3/2010
KR 2013-0107876 A 10/2013

*Primary Examiner* — Cuong Q Nguyen
*Assistant Examiner* — Nishath Yasmeen
(74) *Attorney, Agent, or Firm* — Volentine & Whitt, PLLC

(57) ABSTRACT

A variable resistance memory device includes a plurality of first conductive lines, each of the first conductive lines extends in a first direction, a plurality of second conductive lines are above the first conductive lines, and each of the second conductive lines extend in a second direction transverse to the first direction. A plurality of first memory cells are at intersections where the first and second conductive lines overlap each other, each of the first memory cells including a first variable resistance structure having a first variable resistance pattern, a first sacrificial pattern and a second variable resistance pattern sequentially stacked in the first direction on a first plane. A plurality of third conductive lines are above the second conductive lines, each of the third conductive lines extend in the first direction, and a plurality of second memory cells are at intersections where the second and the third conductive lines overlap each other. Each of the second memory cells includes a second variable resistance structure having a third variable resistance pattern, a second sacrificial pattern and a fourth variable resistance pattern sequentially stacked in the first direction on second plane.

18 Claims, 23 Drawing Sheets

(52) U.S. Cl.
CPC .............. *H01L 45/06* (2013.01); *H01L 45/08* (2013.01); *H01L 45/1233* (2013.01); *H01L 45/1266* (2013.01); *H01L 45/141* (2013.01); *H01L 45/146* (2013.01)

(58) Field of Classification Search
CPC ............. H01L 45/1266; H01L 27/2409; H01L 45/146; H01L 45/1233; H01L 45/124; H01L 45/1246
See application file for complete search history.

(56) References Cited

U.S. PATENT DOCUMENTS

| | | | |
|---|---|---|---|
| 7,759,667 B2 | 7/2010 | Park et al. | |
| 8,206,995 B2 | 6/2012 | Reyes et al. | |
| 8,233,317 B2 | 7/2012 | Breitwisch et al. | |
| 8,394,669 B2 | 3/2013 | Arita et al. | |
| 8,471,360 B2 | 6/2013 | Kreupl et al. | |
| 8,551,855 B2 | 10/2013 | Xu et al. | |
| 2008/0283812 A1 | 11/2008 | Liu | |
| 2010/0038619 A1 | 2/2010 | Tada et al. | |
| 2010/0055829 A1 | 3/2010 | Im et al. | |
| 2010/0093130 A1* | 4/2010 | Oh | H01L 27/2409 438/102 |
| 2011/0149634 A1* | 6/2011 | Schloss | G11C 13/0007 365/148 |
| 2012/0235107 A1* | 9/2012 | Hirota | H01L 45/04 257/2 |
| 2013/0099188 A1 | 4/2013 | Kim et al. | |
| 2013/0168628 A1* | 7/2013 | Hwang | H01L 45/06 257/1 |
| 2013/0248799 A1* | 9/2013 | Song | H01L 45/12 257/2 |
| 2014/0027701 A1 | 1/2014 | Lee et al. | |

* cited by examiner

SECOND CROSS-SECTION

SECOND DIRECTION    THIRD DIRECTION    FIRST DIRECTION

VARIABLE RESISTANCE MEMORY DEVICES AND METHODS OF MANUFACTURING THE SAME

CROSS-REFERENCE TO RELATED APPLICATION

This application claims priority under 35 USC §119 to Korean Patent Application No. 10-2014-0185781, filed on Dec. 22, 2014 in the Korean Intellectual Property Office (KIPO), the contents of which are incorporated by reference herein in their entirety.

TECHNICAL FIELD

Example embodiments relate to semiconductor devices and methods of manufacturing the same. More particularly, example embodiments relate to variable resistance memory devices and methods of manufacturing the same.

BACKGROUND

As a semiconductor device is highly integrated, a variable resistance memory device may have a crossing-point array structure in which memory cells may be formed at crossing points where upper and lower conductive lines cross each other.

SUMMARY

Example embodiments provide a variable resistance memory device including upper and lower memory cells having uniform or consistent electrical characteristics.

Example embodiments provide a method of manufacturing a variable resistance memory device including upper and lower memory cells having uniform or consistent electrical characteristics.

According to example embodiments, there is provided a variable resistance memory device. The variable resistance memory device may include a plurality of first conductive lines on a substrate, each of the first conductive lines extending in a first direction, a plurality of second conductive lines over or above the first conductive lines, and each of the second conductive lines extending in a second direction crossing or transverse to the first direction. A plurality of first memory cells may be at intersections where the first and second conductive lines overlap each other, and each of the first memory cells may include a first variable resistance structure having a first variable resistance pattern, a first sacrificial pattern and a second variable resistance pattern sequentially stacked in the first direction on substantially the same or first plane. A plurality of third conductive lines may be above the second conductive lines, each of the third conductive lines extending in the first direction, and a plurality of second memory cells may be at intersections where the second and the third conductive lines overlap each other. Each of the second memory cells may include a second variable resistance structure having a third variable resistance pattern, a second sacrificial pattern and a fourth variable resistance pattern sequentially stacked in the first direction on substantially the same or second plane.

In example embodiments, the first memory cell may include a first lower electrode, a first switching element, the first variable resistance structure and a first upper electrode sequentially stacked on the first conductive line, and the second memory cell may include a second lower electrode, a second switching element, the second variable resistance structure and a second upper electrode sequentially stacked on the second conductive line.

In example embodiments, each of the first and second memory cells may have a pillar shape including first, second, third and fourth sidewalls.

In example embodiments, the first to fourth variable resistance patterns may include substantially the same material.

In example embodiments, the first to fourth variable resistance patterns may include substantially the same transition metal oxide.

In example embodiments, the first to fourth variable resistance patterns may include at least one of titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), and zinc oxide (ZnOx).

In example embodiments, the variable resistance memory device may further include a first buffer pattern on the first variable resistance structure and a second buffer pattern on the second variable resistance structure, and the first buffer pattern may absorb oxygen from the first and second variable resistance patterns or may supply oxygen thereto, and the second buffer pattern may absorb oxygen from third and fourth variable resistance patterns or may supply oxygen thereto.

In example embodiments, the variable resistance memory device may further include a first capping pattern on first and third sidewalls facing in the first direction of each of the first and second memory cells.

In example embodiments, the first capping pattern may have a material substantially the same as that of the first to fourth variable resistance patterns.

In example embodiments, the first capping pattern may be conformally formed on the first and third sidewalls of each of the first and second memory cells, a sidewall of the second conductive line, and a top surface of the first conductive line.

In example embodiments, the variable resistance memory device may further include a second capping pattern and a third capping layer, and the second capping pattern may be formed on second and fourth sidewalls facing in the second direction of the first memory cell, and a third capping layer may be formed on second and fourth sidewalls facing in the second direction of the second memory cell.

In example embodiments, each of the second capping pattern and the third capping layer may include a material different from that of the first capping pattern.

In example embodiments, the second capping pattern and the third capping layer may include silicon nitride or silicon oxynitride.

In example embodiments, the first and second sacrificial patterns may include an insulating material.

In example embodiments, the first and second sacrificial patterns may include silicon oxide.

In example embodiments, the first and second variable resistance patterns may be formed on both sidewalls of the first sacrificial pattern in the first direction, respectively.

In example embodiments, the third and fourth variable resistance patterns may be formed on both sidewalls of the second sacrificial pattern in the first direction, respectively.

In example embodiments, the variable resistance memory device may further include a first insulation pattern filling a gap between structures disposed in the second direction. Each of the structure may include the first conductive line and the first memory cell sequentially stacked in the second direction.

In example embodiments, the variable resistance memory device may further include a second insulation pattern filling a gap between structures disposed in the first direction. Each of the structures may include the first memory cell, the second conductive line and the second memory cell sequentially stacked.

In example embodiments, the third and fourth variable resistance patterns may include a transition metal oxide, a perovskite-based material, a ferromagnetic material, or a chalcogenide-based material.

According to example embodiments, there is provided a resistance memory device, including a first electrode, a switching element on the first conductive electrode, and a variable resistance structure on the switching element, the variable resistance structure including a first resistance pattern and a second resistance pattern which are horizontally spaced apart from each other. A second electrode may be on the variable resistance structure.

In example embodiments, the variable resistance structure may further comprise an insulating pattern between the first resistance pattern and the second resistance pattern, and the first resistance pattern and the second resistance pattern are separated by the insulating pattern.

In example embodiments, the first and second resistance patterns may be spaced apart from each other in a first direction, and a width in the first direction of each of the first and second resistance patterns is less than a width in a second direction transverse to the first direction.

In example embodiments, a capping layer may be on sidewalls of the switching element and the first and second resistance patterns, and the capping layer may be a same material as a material of the first and second resistance patterns.

In example embodiments, the first and second resistance patterns may include one of a transition metal oxide and a perovskite-based material.

According to example embodiments, a variable resistance memory device may be provided and include a plurality of first conductive lines on an insulation layer of a substrate, each of the first conductive lines extending in a first direction, and a plurality of second conductive lines above the first conductive lines, each of the second conductive lines extending in a second direction transverse to the first direction. A plurality of first memory cells may be at intersections where the first and second conductive lines overlap each other, each of the first memory cells including a first variable resistance structure having variable resistance patterns stacked in the first direction on a first plane. A plurality of third conductive lines may be above the second conductive lines, each of the third conductive lines extending in the first direction. A plurality of second memory cells may be at intersections where the second and the third conductive lines overlap each other, each of the second memory cells including a second variable resistance structure having variable resistance patterns stacked in the first direction on a second plane.

In example embodiments, the first memory cell may include a first lower electrode, a first switching element, the first variable resistance structure and a first upper electrode stacked on the first conductive line, and the second memory cell may include a second lower electrode, a second switching element, the second variable resistance structure and a second upper electrode stacked on the second conductive line.

In example embodiments, a first buffer pattern may be on the first variable resistance structure and a second buffer pattern on the second variable resistance structure, wherein the first buffer pattern exchanges oxygen with the corresponding variable resistance patterns, and the second buffer pattern exchanges oxygen with the corresponding variable resistance patterns.

In example embodiments, the first and second variable resistance structures may have insulating material between the variable resistance patterns.

According to example embodiments, there is provided a method of manufacturing a variable resistance memory device. In the method, a first conductive pattern extending in a first direction may be formed on a substrate, for example, on an insulation layer of a substrate. A plurality of first preliminary memory cells are formed on the first conductive pattern, each of the first preliminary memory cells including a first lower sacrificial pattern and having a pillar shape. A second conductive pattern and a plurality of second preliminary memory structures may be formed on the first preliminary memory cells, each of the second preliminary memory structures including a first upper sacrificial pattern, and the second conductive pattern and each of the second preliminary memory structures extending in a second direction substantially perpendicular or transverse to the first direction. Each of the first lower and the upper sacrificial patterns may be partially etched exposed by sidewalls of the first preliminary memory cells and the second preliminary memory structures to form a first sacrificial pattern, a second upper sacrificial pattern, a first recess adjacent to sidewalls of the first sacrificial pattern and a second recess adjacent to sidewalls of the second upper sacrificial pattern. A variable resistance pattern and a capping pattern may be formed to form a first memory cell, the variable resistance pattern filling the first recess and second recess, and the capping pattern being formed on a sidewall of each of the first preliminary memory cells, a top surface of the first conductive pattern and a sidewall of each of the second preliminary memory structures. A third conductive pattern extending in a first direction may be formed on each of the second preliminary memory structures. Also, the second preliminary memory structures may be etched to form a trench between the third conductive patterns, and to form a second memory cell including a second sacrificial pattern.

In example embodiments, each of the first preliminary memory cells may be formed to include a first lower electrode, a first lower sacrificial pattern and a first upper electrode sequentially stacked.

In example embodiments, partially etching the first lower and upper sacrificial patterns may be performed by an isotropic etching process.

In example embodiments, the variable resistance pattern and the capping pattern may be formed by the same deposition process, and forming the variable resistance pattern and the capping pattern may include conformally depositing a variable resistance layer.

In example embodiments, the variable resistance pattern and the capping pattern may be formed to include substantially the same transition metal oxide.

In example embodiments, each of the second preliminary memory structures may be formed to include a second preliminary lower electrode, a second preliminary switching element and the first upper sacrificial pattern that may be sequentially stacked and may extend in the second direction.

In example embodiments, when the second preliminary switching pattern is formed, a polysilicon layer may be formed on the second preliminary lower electrode. The polysilicon layer may be doped with impurities. Also, the polysilicon layer may be annealed to activate the impurities.

In example embodiments, the capping pattern on the sidewall of each of the first preliminary memory cells, the top surface of the first conductive pattern and the sidewalls of the second conductive pattern and the second preliminary memory structures may be etched.

In example embodiments, a first capping pattern may be further formed on facing sidewalls in the second direction of each of the first preliminary memory cells, a sidewall of the first conductive pattern and the insulation layer, and the first capping pattern may be formed to include a material different from the material of the capping pattern.

In example embodiments, a third capping layer may be further formed on facing sidewalls in the second direction of the second memory cell, the top surface of the second conductive pattern and the sidewall and the top surface of the third conductive pattern, wherein the third capping pattern is formed to include a material different from that of the capping pattern.

According to example embodiments, there is provided a method of making a variable resistance memory device. The method may include forming a plurality of first conductive lines on an insulation layer of a substrate, each of the first conductive lines extending in a first direction, and forming a plurality of second conductive lines above the first conductive lines, each of the second conductive lines extending in a second direction transverse to the first direction. The method may include forming a plurality of first memory cells at intersections where the first and second conductive lines overlap each other, each of the first memory cells including a first variable resistance structure having variable resistance patterns stacked in the first direction on a first plane, forming a plurality of third conductive lines above the second conductive lines, each of the third conductive lines extending in the first direction, and forming a plurality of second memory cells at intersections where the second and the third conductive lines overlap each other, each of the second memory cells including a second variable resistance structure having variable resistance patterns stacked in the first direction on a second plane.

In example embodiments, each of the first memory cells may be formed to include a first lower electrode, a first switching element, the first variable resistance structure and a first upper electrode stacked on the first conductive line, and the second memory cell may be formed to include a second lower electrode, a second switching element, the second variable resistance structure and a second upper electrode stacked on the second conductive line.

In example embodiments, the method may include forming a first buffer pattern on the first variable resistance structure and a second buffer pattern on the second variable resistance structure, wherein the first buffer pattern exchanges oxygen with the corresponding variable resistance patterns, and the second buffer pattern exchanges oxygen with the corresponding variable resistance patterns.

In example embodiments, the first and second variable resistance structures may be formed to have insulating material between the variable resistance patterns.

BRIEF DESCRIPTION OF THE DRAWINGS

Example embodiments will be more clearly understood from the following detailed description taken in conjunction with the accompanying drawings. FIGS. 1 to 22 represent non-limiting, example embodiments as described herein.

FIGS. 1, 2A, 2B and 3 are a perspective view, cross-sectional views and a plan view, respectively, illustrating a variable resistance memory device in accordance with example embodiments;

FIGS. 4 to 15 are perspective views illustrating stages of a method of manufacturing a variable resistance memory device in accordance with example embodiments;

FIG. 16 is a perspective view illustrating a variable resistance memory device in accordance with example embodiments;

FIGS. 17 to 19 are perspective views illustrating stages of a method of manufacturing a variable resistance memory device in accordance with example embodiments;

FIG. 20 is a perspective view illustrating a variable resistance memory device in accordance with example embodiments;

FIG. 21 is a perspective view illustrating a stage of a method of manufacturing a variable resistance memory device in accordance with example embodiments;

FIG. 22 is a block diagram illustrating a data processing system in accordance with example embodiments.

DESCRIPTION OF EMBODIMENTS

Figure 1:
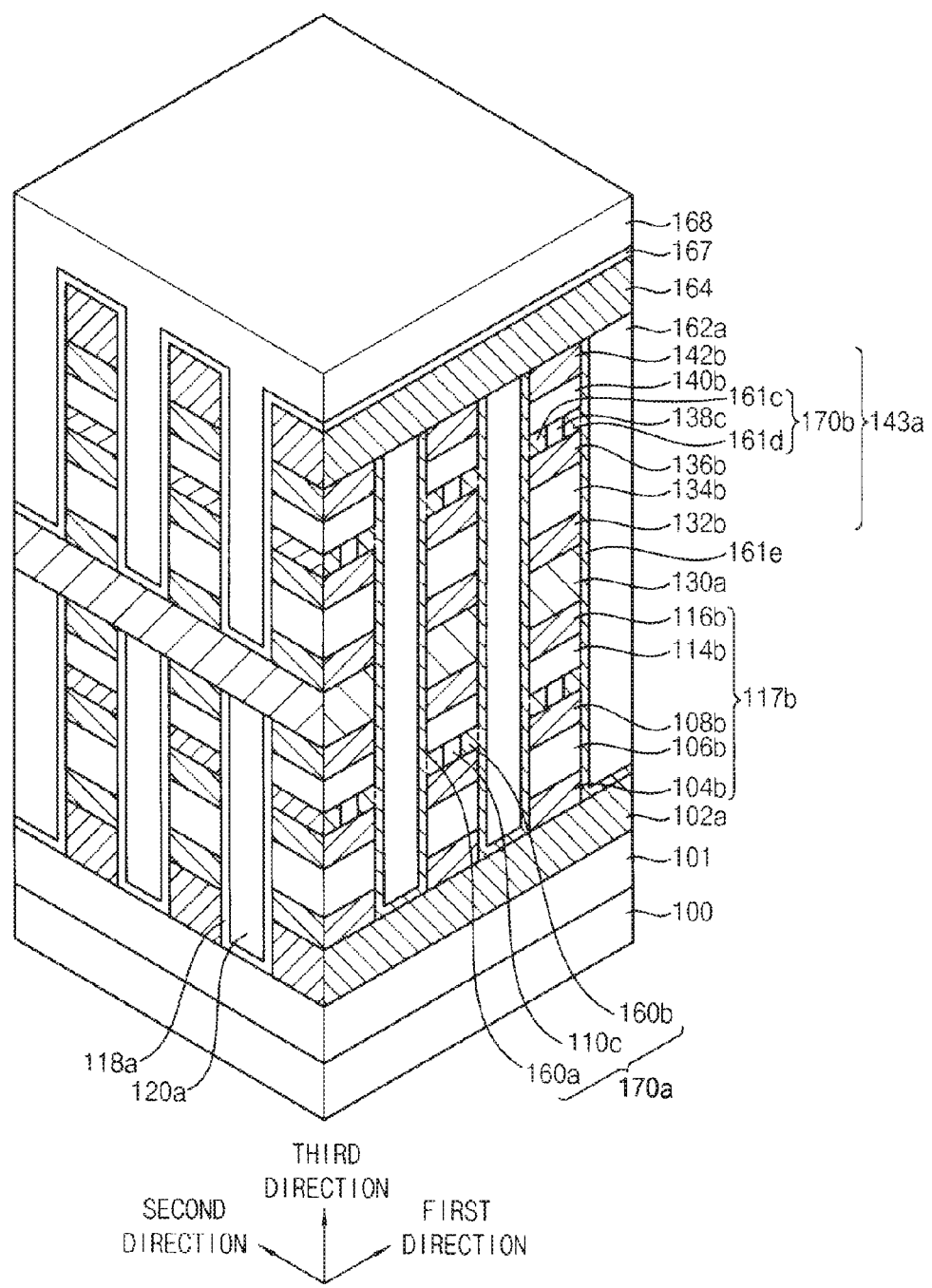
Figure 2A:
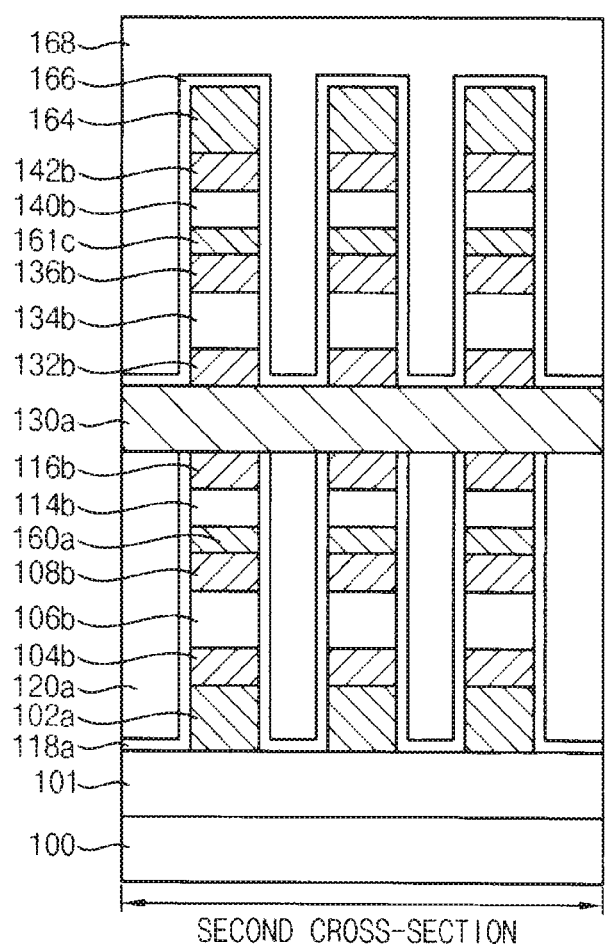
Figure 2B:
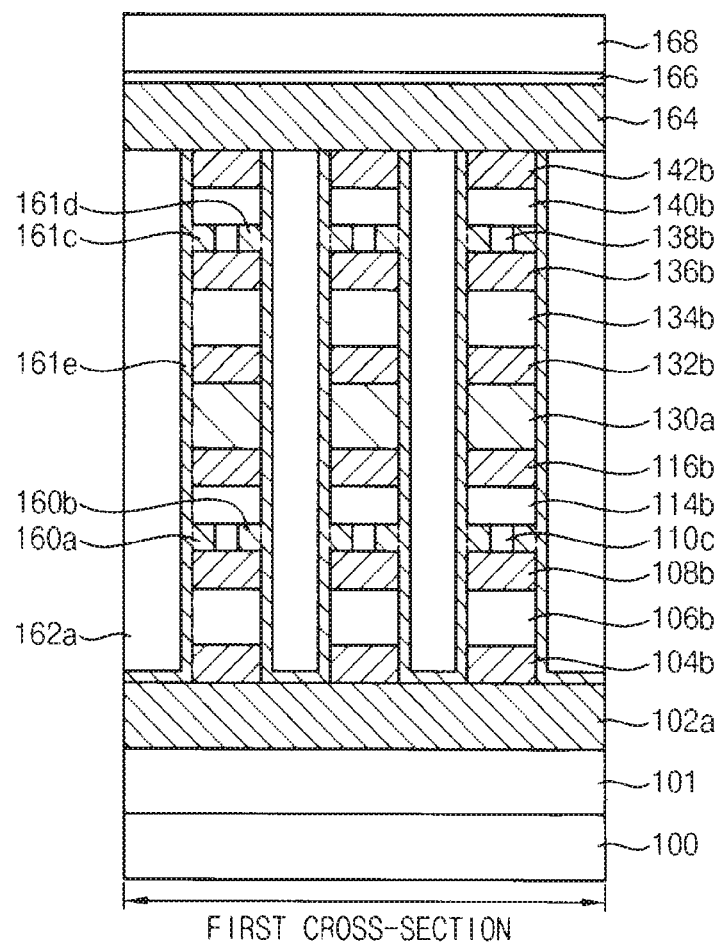
Figure 3:
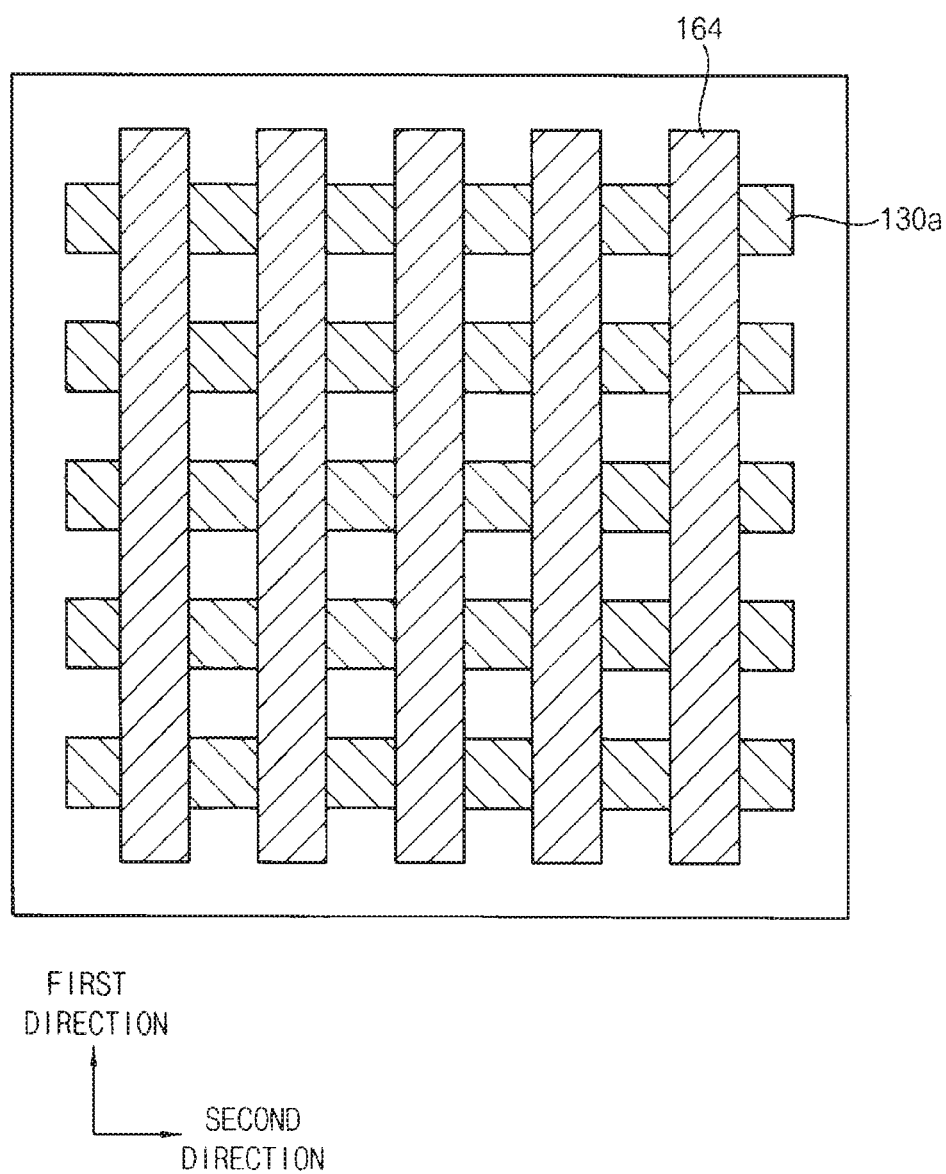

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 2A, 2B, and 3 are a perspective view, a cross-sectional view, and a plan view, respectively, illustrating a variable resistance memory device in accordance with example embodiments. Particularly, FIGS. 2A and 2B include cross-sectional views taken along lines extending in second and first directions, respectively.

The first and second directions may be substantially parallel to a top surface of a substrate, and may be substantially perpendicular to each other. Also, a third direction may be substantially perpendicular to the top surface of the substrate. Hereinafter, the definitions of the first to third directions may be the same in all figures.

Referring to FIGS. 1, 2A, 2B, and 3, the variable resistance memory device may include an insulation layer 101, a first conductive line 102a, a second conductive line 130a, a first memory cell 117b, a second memory cell 143a and a third conductive line 164.

The insulation layer 101 may be formed on a substrate 100. The insulating layer 101 may include an insulating material, e.g., silicon oxide, silicon nitride, silicon oxynitride, etc. Alternatively, the substrate 100 may include an insulating material.

The first conductive line 102a may be formed on the insulation layer 101. The first conductive line 102a may extend in the first direction, and a plurality of first conductive lines 102a may be arranged in the second direction. The first conductive line 102a may include a metal, e.g., tungsten, copper, aluminum, titanium, tantalum, etc., or a metal nitride thereof. In example embodiments, the first conductive line 102a may serve as a lower bit line of the variable resistance memory device.

The second conductive line 130a may be formed over the first conductive line 102a. The second conductive line 130a may extend in the second direction, and a plurality of second conductive lines 130a may be arranged in the first direction. The second conductive line 130a may include a metal, e.g., tungsten, copper, aluminum, titanium, tantalum, etc., or a metal nitride thereof. In example embodiments, the second conductive line 130a may serve as a common word line of the variable resistance memory device.

The first memory cell 117b may be formed at an intersection where the first and second conductive lines 102a and 130a may cross or overlap each other. That is, the first memory cell 117b may be disposed between the first and second conductive lines 102a and 130a in the third direction. In example embodiments, the first memory cell 117b may have a pillar shape having first, second, third and fourth sidewalls. Hereinafter, both sidewalls facing each other in the first direction are referred to as the first and third sidewalls, respectively, and both sidewalls facing each other in the second direction are referred to as the second and fourth sidewalls, respectively.

The third conductive line 164 may be formed over the second conductive line 130a. The third conductive line 164 may extend in the first direction, and a plurality of first conductive lines 164 may be arranged in the second direction. The first and third conductive lines 102a and 164 may overlap each other. The third conductive line 164 include a metal, e.g., tungsten, copper, aluminum, titanium, tantalum, etc., or a metal nitride thereof. In example embodiments, the third conductive line 164 may serve as an upper bit line of the variable resistance memory device.

The second memory cell 143a may be formed at an intersection where the second and third conductive lines 130a and 164 may cross or overlap each other. That is, the second memory cell 143a may be disposed between the second and third conductive lines 130a and 164 in the third direction. In example embodiments, the second memory cell 143a may have a pillar shape having first to fourth sidewalls. Hereinafter, both sidewalls facing each other in the first direction are referred to as the first and third sidewalls, respectively, and both sidewalls facing each other in the second direction are referred to as the second and fourth sidewalls, respectively.

The first memory cell 117b may include a first switching element 106b and a first variable resistance structure 170a sequentially stacked on the first conductive line 102a. Alternatively, the first memory cell 117b may include the first variable resistance structure 170a and the first switching element 106b sequentially stacked on the first conductive line 102a.

In example embodiments, a first lower electrode 104a may be further formed under the first switching element 106b, and a first middle electrode 108b may be further formed on the first switching element 106b. Also, a first buffer pattern 114b and a first upper electrode 116b may be further formed between the first variable resistance structure 170a and the second conductive line 130a in the third direction.

That is, the first memory cell 117b may include the first lower electrode 102a, the first switching element 106b, the first middle electrode 108b, the first variable resistance structure 170a, the first buffer pattern 114b and the first upper electrode 116b.

The first lower, middle and upper electrodes 104b, 108b and 116b may include a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), etc. Alternatively, the first lower and upper electrodes 104b and 116b may include a metal nitride, e.g., titanium nitride (TiNx), tungsten nitride (WNx), tantalum nitride (TaNx), zirconium nitride (ZrNx), etc, or a metal silicon nitride, e.g., titanium silicon nitride (TiSiNx), tungsten silicon nitride (WSiNx), tantalum silicon nitride (TaSiNx), zirconium silicon nitride (ZrSiNx), etc.

The first switching element 106b may include a diode. In example embodiments, the first switching element 106b may include a semiconductor pattern including a region doped with n-type impurities and a region doped with p-type impurities as a p-n diode. For example, the semiconductor pattern may include a silicon pattern (e.g., crystalline silicon pattern) including a region doped with n-type impurities and a region doped with p-type impurities as the p-n diode.

The first variable resistance structure 170a may include a first variable resistance pattern 160a, a first sacrificial pattern 110c and a second variable resistance pattern 160b. Each of the first variable resistance pattern 160a, the first sacrificial pattern 110c and the second variable resistance pattern 160b may have a length in the second direction greater than that in the first direction. The first variable resistance pattern 160a, the first sacrificial pattern 110c and the second variable resistance pattern 160b may be sequentially stacked in the first direction. That is, the first and second variable resistance patterns 160a and 160b may be formed on both sidewalls of the first sacrificial pattern 110c, respectively. The first and second variable resistance patterns 160a and 160b may be horizontally spaced apart from each other and may be separated by the first sacrificial pattern 110c in the first direction. Thus, a width of each of the first variable resistance pattern 160a, the first sacrificial pattern 110c and the second variable resistance pattern 160b in the first direction may be less than that of the first memory cell 117b in the first direction.

The first and second variable resistance patterns 160a and 160b may be formed by the same deposition process, and thus may include substantially the same material. In example embodiments, the first and second variable resistance patterns 160a and 160b may include a material which may have an insulating property when a voltage is not supplied to the first lower and upper electrodes 104b and 116b.

In example embodiments, the first and second variable resistance patterns 160a and 160b may include a transition metal oxide, e.g., titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), zinc oxide (ZnOx), etc. These may be used alone or in a combination thereof.

In example embodiments, the first and second variable resistance patterns 160a and 160b may include a perovskite-based material, e.g., STO ($SrTiO_3$), BTO ($BaTiO_3$), PCMO ($Pr_{1-x}Ca_xMnO_3$), etc.

The first sacrificial pattern 110c may include an insulating material having an etching selectivity with respect to other materials of the first memory cell 117b. For example, the first sacrificial pattern 110c may include, e.g., silicon oxide.

The first buffer pattern 114b may be further formed when the first variable resistance structure 170a may include a material of which an electrical resistance may be changed due to oxygen vacancy or oxygen migration. In this case, the first buffer pattern 114b may absorb oxygen from the first variable resistive structure 170a, or may supply oxygen to the first variable resistive structure 170a. In example embodiments, the first buffer pattern 114b may include a transition metal oxide, e.g., tantalum oxide (TaOx).

A first capping pattern 118a may be conformally formed on the second and fourth sidewalls of the first memory cell 117b, a sidewall of the first conductive line 102a and a top surface of the insulation layer 101. The first capping pattern 118a may include, e.g., silicon nitride, silicon oxynitride, etc.

A first insulation pattern 120a may be formed on the first capping pattern 118a to fill a gap between the first memory cells 117b in the second direction. The first insulation pattern 120a may include, e.g., silicon oxide, such as TOSZ (Tonen Silazene), FOX (Flowable Oxide), SOG (Spin On Glass), etc.

The second conductive line 130a may be formed on the first insulation pattern 120a and the first memory cell 117b.

The second memory cell 143a may include a second switching element 134b and a second variable resistance structure 170b sequentially stacked on the second conductive line 130a. Alternatively, the second memory cell 143a may include a second variable resistance structure 170b and a second switching element 134b sequentially stacked on the second conductive line 130a.

In example embodiments, a second lower electrode 132b may be further formed under the second switching element 134b, and a second middle electrode 136b may be further formed on the second switching element 134b. Also, a second buffer pattern 140b and a second upper electrode 142b may be further formed between the second variable resistance structure 170b and the third conductive line 164 in the third direction.

That is, the second memory cell 143a may include the second lower electrode 132b, the second switching element 134b, the second middle electrode 136b, the second variable resistance structure 170b, the second buffer pattern 140b and the second upper electrode 142b.

The second variable resistance structure 170b may include a third variable resistance pattern 161c, a second sacrificial pattern 138c and a fourth variable resistance pattern 161d. Each of the third variable resistance pattern 161c, the second sacrificial pattern 138c and the fourth variable resistance pattern 161d may have a length in the second direction greater than that in the first direction. The third variable resistance pattern 161c, the second sacrificial pattern 138c and the fourth variable resistance pattern 161d may be sequentially stacked in the first direction. That is, the third and fourth variable resistance patterns 161c and 161d may be formed on both sidewalls of the second sacrificial pattern 138c, respectively. The third and fourth variable resistance patterns 161c and 161d may be horizontally spaced apart from each other and may be separated by the second sacrificial pattern 138c in the first direction. Thus, a width of each of the third variable resistance pattern 161c, the second sacrificial pattern 138c and the fourth variable resistance pattern 161d in the first direction may be less than that of the second memory cell 170b in the first direction.

The first to fourth variable resistance patterns 160a, 160b, 161c and 161d may be formed by the same deposition process, and thus may include substantially the same material. That is, the first to fourth variable resistance patterns 160a, 160b, 161c and 161d may have substantially the same electrical property, and thus a difference of electrical characteristics between the first and second memory cells 117b and 143a may decrease.

The second sacrificial pattern 138c may include an insulating material having an etching selectivity with respect to other materials of the second memory cell 143a. For example, the second sacrificial pattern 138c may include, e.g., silicon oxide.

The second memory cell 143a may have a structure substantially the same as that of the first memory cell 117b. That is, the second lower electrode 132b, the second switching element 134b, the second middle electrode 136b, the second variable resistance structure 170b, the second buffer pattern 140b and the second upper electrode 142b included in the second memory cell 143a may be substantially the same as the first lower electrode 104b, the first switching element 106b, the first middle electrode 108b, the first variable resistance structure 170a, the first buffer pattern 114b and the first upper electrode 116b included in the first memory cell 117b, respectively.

A second capping pattern 161e may be conformally formed on the first and third sidewalls of the first and second memory cells 117b and 143a, a sidewall of the second conductive line 130a and a top surface of the first conductive line 102a.

The second capping pattern 161e may be also formed during forming the first to fourth variable resistance patterns 160a, 160b, 161c and 161d. Thus, the second capping pattern 161e may have a material substantially the same as those of the first to fourth variable resistance patterns 160a, 160b, 161c and 161d. However, electrodes may not be formed at both sidewalls of the second capping pattern 161e, and thus the second capping pattern 161e may not serve as a variable resistance element, but may serve as an insulating material.

In example embodiments, the second capping pattern 161e may include a transition metal oxide, e.g., titanium oxide, zirconium oxide, aluminum oxide, hafnium oxide, tantalum oxide, niobium oxide, cobalt oxide, tungsten oxide, lanthanum oxide, zinc oxide, etc. These may be used alone or in a combination thereof.

In example embodiments, the second capping pattern 161e may include a perovskite-based material, e.g., STO, BTO, PCMO, etc. Thus, the second capping pattern 161e may include a material different from that of the first capping pattern 118a.

A second insulation pattern 162a may be formed on the second capping pattern 161e to fill a gap between the first and second memory cells 117b and 143a in the first direction. The second insulation pattern 162a may include, e.g., silicon oxide, such as TOSZ, FOX, SOG, etc.

The third conductive line 164 may be formed on the second insulation pattern 162a and the second memory cell 143a.

A third capping layer 167 may be conformally formed on the second and fourth sidewalls of the second memory cell 143a, a top surface of the second conductive line 130a and a sidewall and a top surface of the third conductive line 164. For example, the third capping layer 167 may include, e.g., silicon nitride, silicon oxynitride, etc.

A third insulating interlayer 168 may be formed on the third capping layer 167 to fill a gap between the second memory cells 143a in the second direction, and may cover the third conductive line 164. The third insulating interlayer 168 may include, e.g., silicon oxide, such as TOSZ, FOX, SOG, etc.

As described above, each of the first and second memory cells 117b and 143a may include first to fourth variable resistance patterns 160a, 160b, 161c and 161d, which may be formed by the same deposition process. That is, the first to fourth variable resistance patterns 160a, 160b, 161c and 161d may include substantially the same material, and thus may have substantially the same electrical property. Thus, the first and second memory cells 117b and 143a may have substantially the same electrical characteristics as each other and desired characteristics.

In example embodiments, the variable resistance memory may include the first and second memory cells 117b and 143a sequentially stacked in the third direction. Alternatively, the variable resistance memory may include at least three of memory cells sequentially stacked in the third direction.

FIGS. 4 to 15 are perspective views illustrating stages of a method of manufacturing a variable resistance memory device in accordance with example embodiments.

Figure 4:
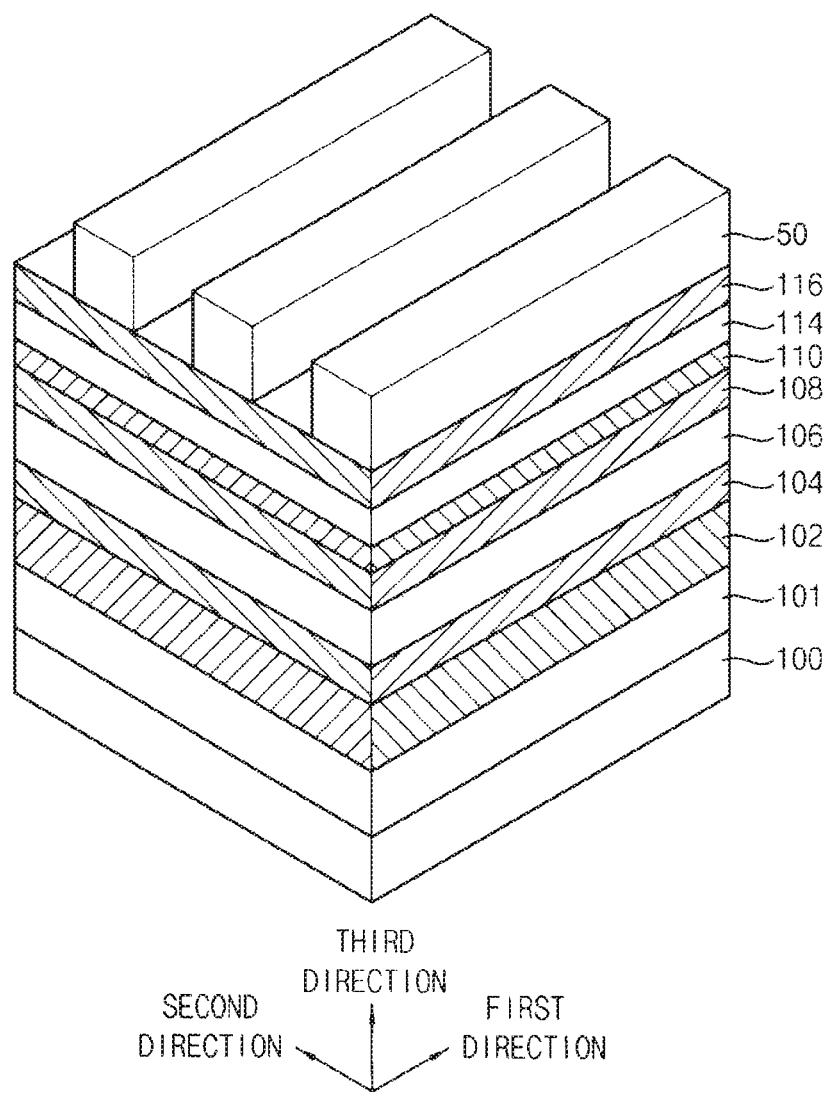

Referring to FIG. 4, an insulation layer 101 may be formed on a substrate 100. A first conductive layer 102, a first preliminary memory structure and a first hard mask 50 may be formed on the insulation layer 101. The first insulation layer 101 may be formed of an insulating material, e.g., silicon oxide, silicon nitride or silicon oxynitride. In some embodiments, the substrate 100 may include an insulating material.

The first conductive layer 102 may be formed of, e.g., a metal, e.g., tungsten, copper, aluminum, titanium, tantalum, etc., or a metal nitride thereof.

The first preliminary memory structure may be formed to include at least a first switching layer 106 and a first sacrificial layer 110. In example embodiments, a first lower electrode layer 104 may be further formed under the first switching layer 106, and a first middle electrode layer 108 may be further formed on the first switching layer 106. Also, a first buffer layer 114 and a first upper electrode layer 116 may be further formed on the first sacrificial layer 110. That is, the first preliminary memory structure may be formed to include the first lower electrode layer 104, the first switching layer 106, the first middle electrode layer 108, the first sacrificial layer 110, the first buffer layer 114 and the first upper electrode layer 116 sequentially stacked.

Each layer of the first preliminary memory structure may be formed by, e.g., a physical vapor deposition (PVD) process, a sputtering process, an atomic layer deposition (ALD) process, a chemical vapor deposition (CVD) process, etc.

The first lower, middle and upper electrode layers 104, 108 and 116 may be formed of a metal, e.g., tungsten, platinum, palladium, rhodium, ruthenium, iridium, copper, aluminum, titanium, tantalum, etc. Alternatively, the first lower and upper electrode layers 104 and 116 may be formed of a metal nitride, e.g., titanium nitride, tungsten nitride, tantalum nitride, zirconium nitride, etc, or a metal silicon nitride, e.g., titanium silicon nitride, tungsten silicon nitride, tantalum silicon nitride, zirconium silicon nitride, etc.

The first switching layer 106 may be formed of a semiconductor layer for forming a diode. In example embodiments, a polysilicon layer may be formed on the first lower electrode layer 104, and n-type impurities and p-type impurities may be doped into the polysilicon layer, respectively, to form the first switching layer 106 (e.g., a p-n diode). In example embodiments, after forming the polysilicon layer 106, a first annealing may be performed for crystallizing polysilicon. Also, after doping the impurities, a second annealing may be performed for activation of the impurities. The first annealing may be performed at a first temperature of about 500° C. to about 700° C. for about 4 hours to about 8 hours. The second annealing may be preformed at a second temperature higher than the first temperature for about 1 second to about 60 seconds.

The first sacrificial layer 110 may be formed of an insulating material having an etching selectivity with respect to other materials of the first preliminary memory structure. For example, the first sacrificial layer 110 may be formed of, e.g., silicon oxide.

The first buffer layer 114 may absorb oxygen from a lower layer, or may supply oxygen to the lower layer. In example embodiments, the first buffer layer 114 may be formed of a transition metal oxide, e.g., tantalum oxide (TaOx).

The first hard mask 50 may be formed by depositing a first hard mask layer and patterning the first hard mask layer by a photolithograph process. The first hard mask layer may be formed of, e.g., silicon nitride. The first hard mask 50 may be formed to extend in the first direction.

The first preliminary memory structure may not include a variable resistance layer for storing data in each of memory cells. The first preliminary memory structure may be formed to include the first sacrificial layer 110 instead of the variable resistance layer.

Figure 5:
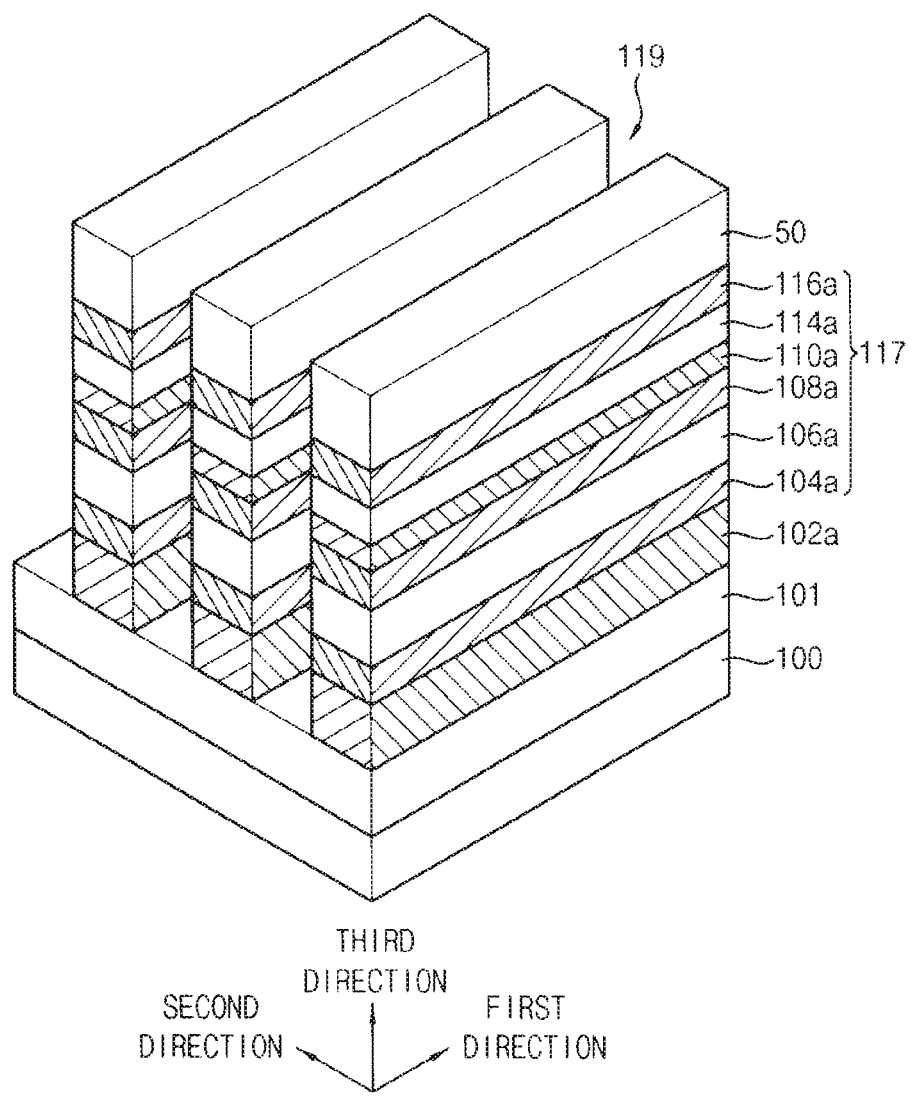
Figure 6:
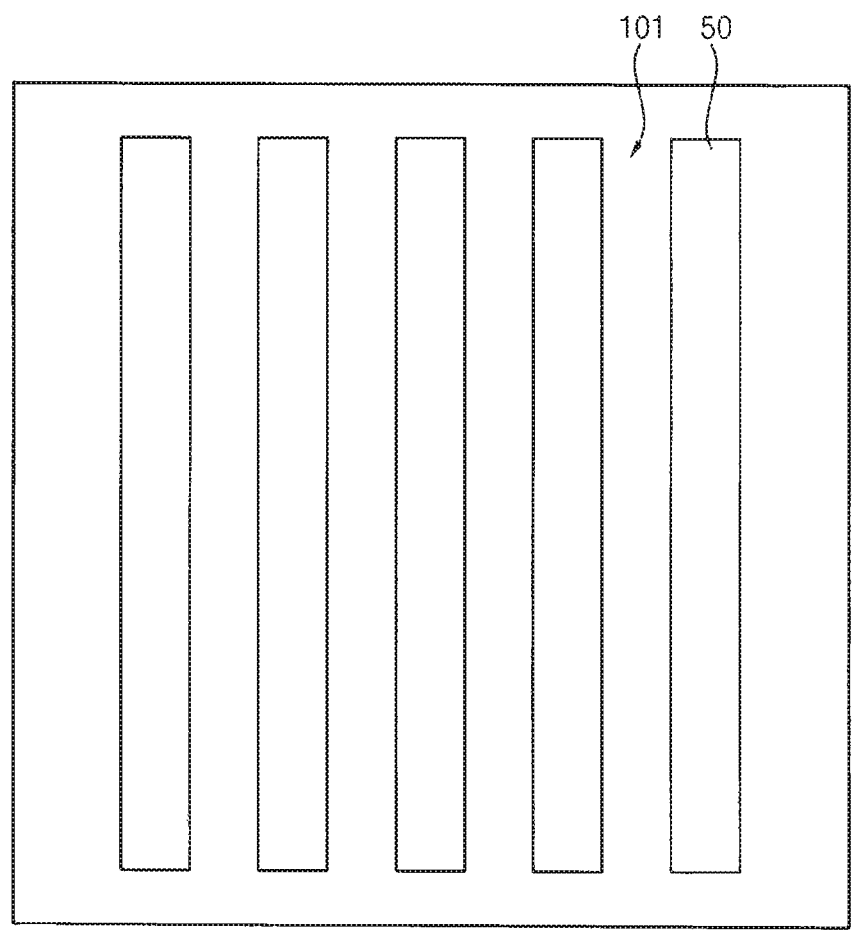

Referring to FIGS. 5 and 6, the first preliminary memory structure and the first conductive layer 102 may be etched using the first hard mask 50 as an etching mask to form a first preliminary structure including a first conductive line 102a, a first preliminary memory cell structure 117 and the first hard mask 50 sequentially stacked on the insulation layer 101.

A plurality of first preliminary structures may be formed, and each of the first preliminary structures may extend in the first direction. A first trench 119 may be formed between the first preliminary structures. In example embodiments, when the first trench 119 is formed, an upper portion of the insulation layer 101 may be also etched.

The first conductive line 102a may serve as a lower bit line of a first memory cell, which may be formed at a lower portion of the variable resistance memory device.

In example embodiments, the first preliminary memory cell structure 117 may be formed to include a first preliminary lower electrode 104a, a first preliminary switching element 106a, a first preliminary middle electrode 108a, a first lower sacrificial pattern 110a, a first preliminary buffer pattern 114a and a first preliminary upper electrode 116a sequentially stacked.

Figure 7:
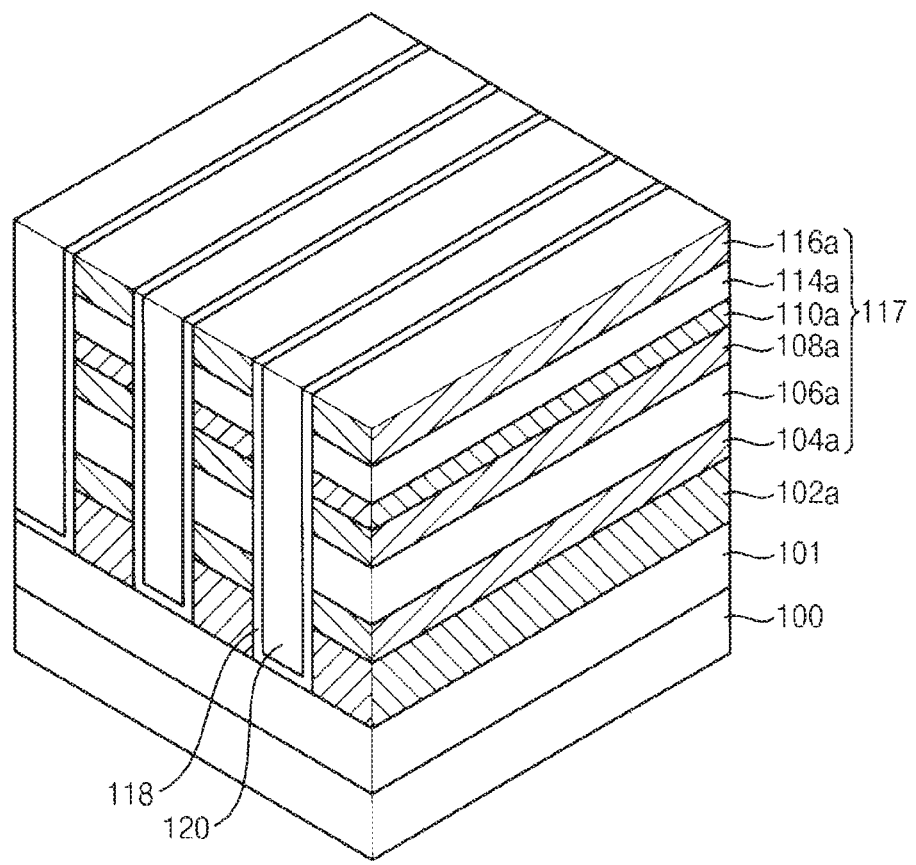

Referring to FIG. 7, a first capping layer 118 and a first insulating interlayer 120 may be formed in the first trench 119. The first hard mask 50 may be removed.

Particularly, the first capping layer 118 may be conformally formed on an inner wall of the first trench 119 and a surface of the first hard mask 50. The first capping layer 118 may be formed of include, e.g., silicon nitride. The first insulating interlayer 120 may be formed on the first capping layer 118 to fill a remaining portion of the first trench 109. The first insulating interlayer 120 may be formed to include, e.g., silicon oxide. A width of the first trench 119 may be narrow, and thus the first insulating interlayer 120 may be formed of a material having good gap filling characteristics. In example embodiments, the first insulating interlayer 120 may be formed by depositing a layer including TOSZ, FOX or SOG, and an annealing the layer. The annealing process may be performed at a temperature of about 400° C. to about 600° C. for about 0.5 hours to about 2 hours.

Upper portions of the first capping layer 118 and the first insulating interlayer 120 may be planarized until a top surface of the first preliminary upper electrode 116a may be exposed. In the planarization process, the first hard mask 50 may be also removed. In example embodiments, the planarization process may be performed by a chemical mechanical polishing (CMP) process and/or an etch back process.

Figure 8:
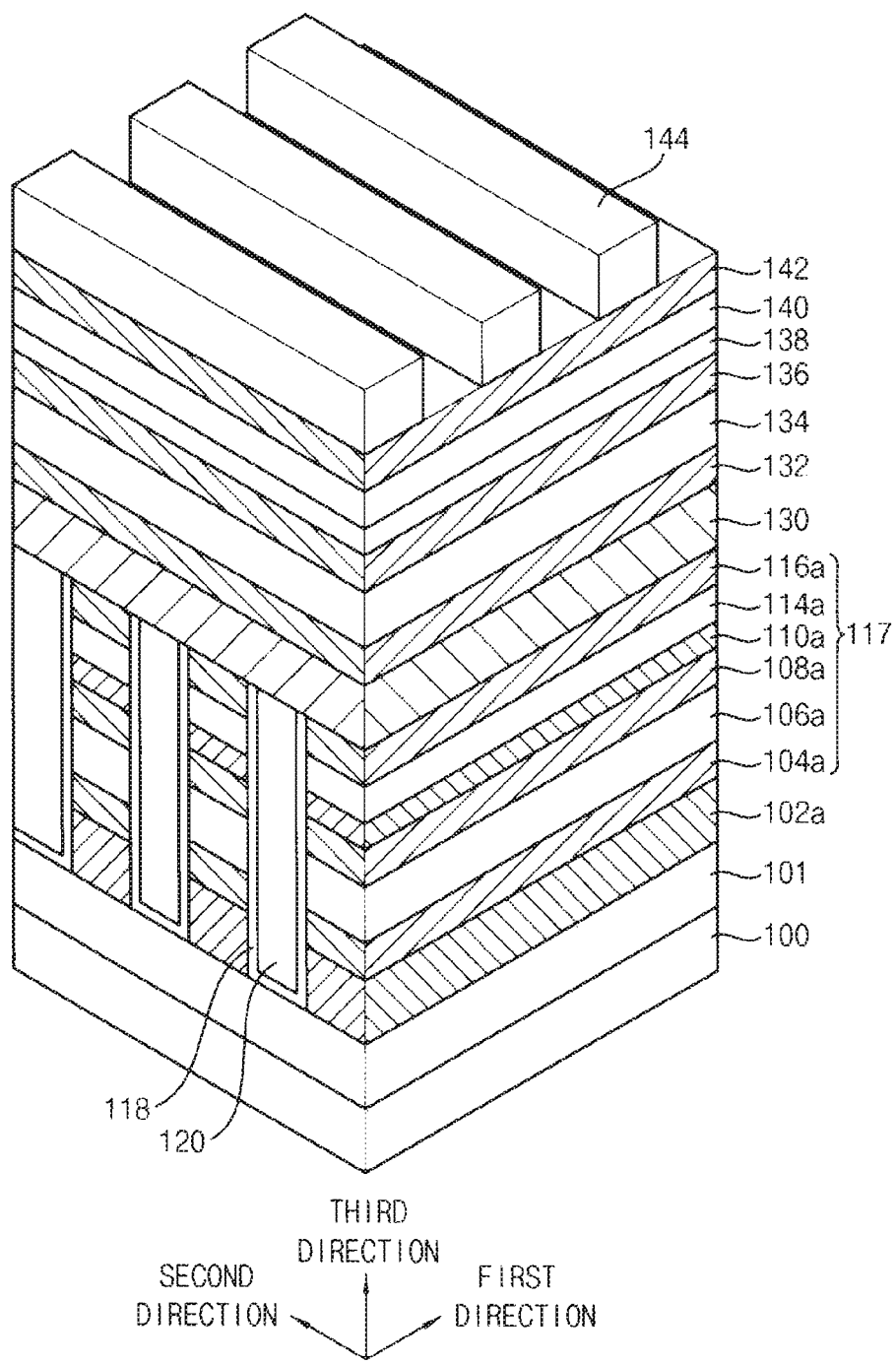

Referring to FIG. 8, a second conductive layer 130, a second preliminary memory structure and a second hard mask 144 may be sequentially formed on the first insulating interlayer 120, the first capping layer 118 and the first preliminary memory cell structure 117.

The second conductive layer 130 may be formed of a metal e.g., tungsten, copper, aluminum, titanium, tantalum, etc., or a metal nitride thereof.

The second preliminary memory structure may be formed to include at least a second switching layer 134 and a second sacrificial layer 138. In example embodiments, a second lower electrode layer 132 may be further formed under the second switching layer 134, and a second middle electrode layer 136 may be further formed on the second switching layer 134. Also, a second buffer layer 140 and a second upper electrode layer 142 may be further formed on the second sacrificial layer 138. That is, the second preliminary memory structure may include the second lower electrode layer 132, the second switching layer 134, the second middle electrode layer 136, the second sacrificial layer 138, the second buffer layer 140 and the second upper electrode layer 142 sequentially stacked.

The second preliminary memory structure may be substantially the same as the first preliminary memory structure. Thus, the second lower electrode layer 132, the second switching layer 134, the second middle electrode layer 136, the second sacrificial layer 138, the second buffer layer 140 and the second upper electrode layer 142 included in the second preliminary memory structure may be substantially the same as the first lower electrode layer 104, the first switching layer 106, the first middle electrode layer 108, the first sacrificial layer 110, the first buffer layer 114 and the first upper electrode layer 116 included in the first preliminary memory structure, respectively.

The second preliminary memory structure may be formed by performing a deposition process and an annealing process at a high temperature. In example embodiments, when the second switching layer 134 is formed, a third annealing process for crystallizing a polysilicon layer and a fourth annealing process for the activation of the impurities in the polysilicon layer may be performed. In example embodiments, the third annealing process may be performed at a third temperature of about 500° C. to about 700° C. for about 4 hours to about 8 hours. Also, the fourth annealing process may be preformed at a fourth temperature higher than the third temperature for about 1 second to about 60 seconds.

The first preliminary memory cell structure 117 under the second conductive layer 130 may not include a variable resistance layer. Thus, when the first to fourth annealing processes are performed, the variable resistance layer of the first memory cell may not be degraded.

Also, the second preliminary memory structure may not include a variable resistance layer for storing data in each of memory cells. The second preliminary memory structure may be formed to include the second sacrificial layer 138 instead of the variable resistance layer.

The second hard mask 144 may be formed by depositing a second hard mask layer, and patterning the second hard mask layer by a photolithograph process. The second hard mask layer may be formed of include, e.g., silicon nitride. The second hard mask 144 may be formed to extend in the first direction.

Figure 9:
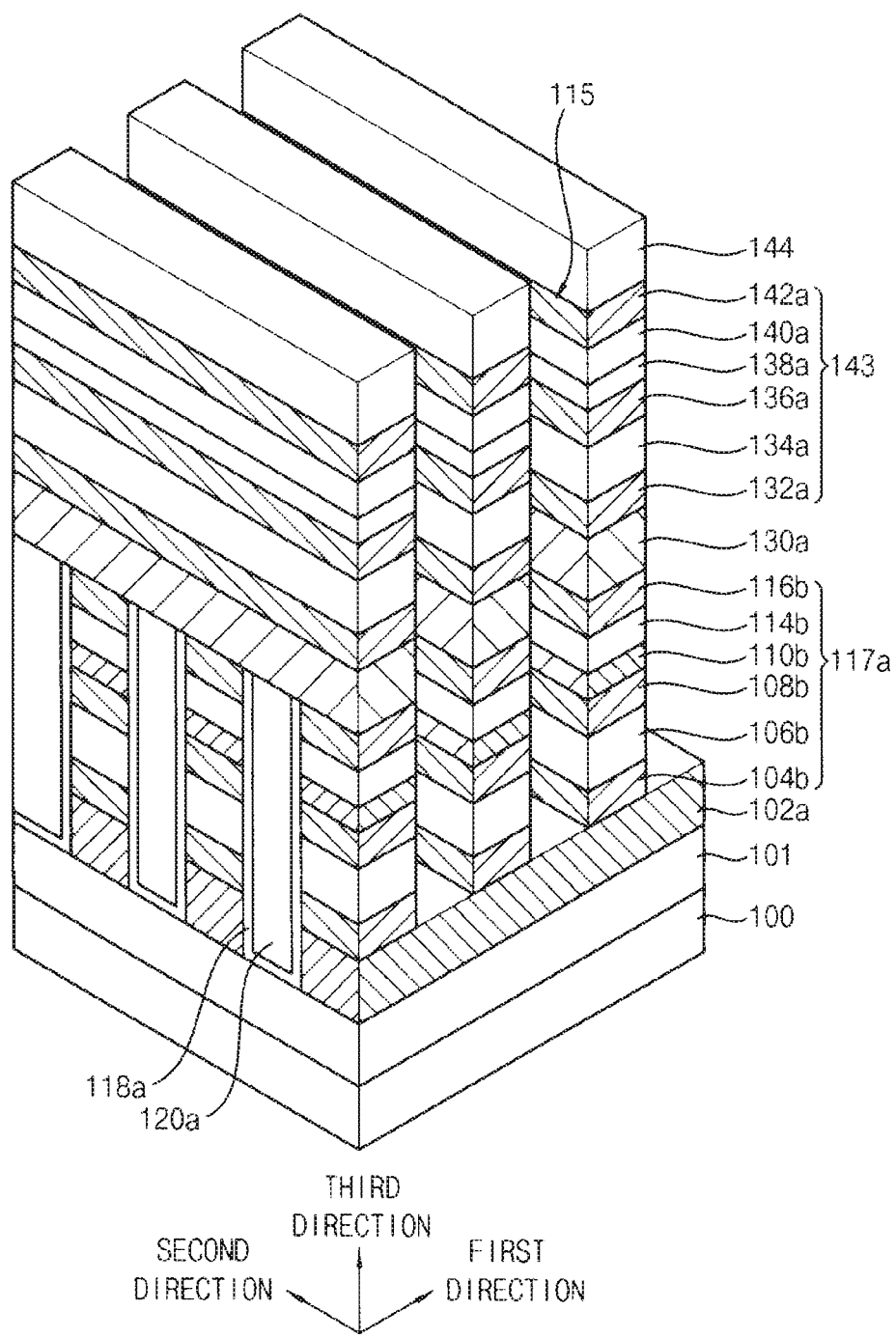
Figure 10:
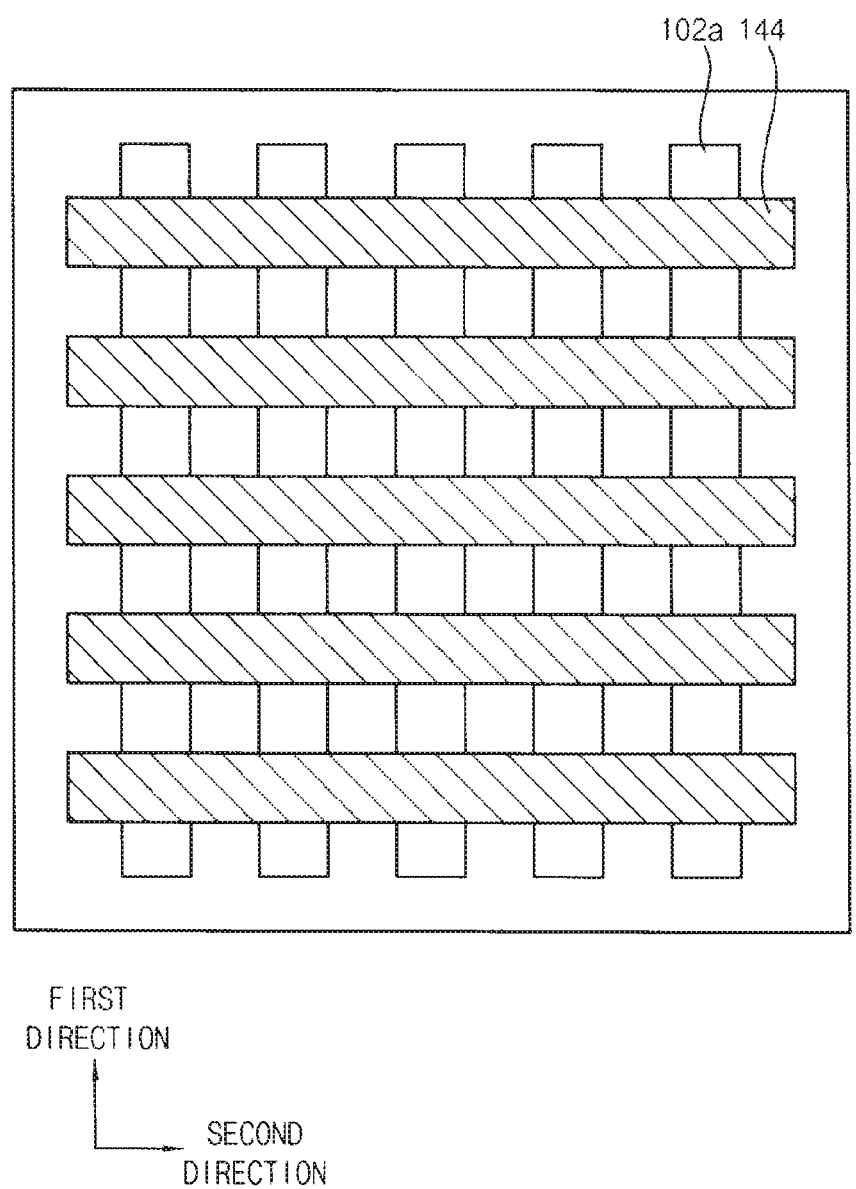

Referring to FIGS. 9 and 10, the second preliminary memory structure, the second conductive layer 130, the first preliminary memory cell structure 117, the first insulating interlayer 120 and the first capping layer 118 may be etched to form a second trench 115 exposing a top surface of the first conductive line 102a.

As described above, the first preliminary memory cell structure 117 may be etched in the second direction to form a first preliminary memory cell 117a on the first conductive line 102a. The first preliminary memory cell 117a may have a pillar shape including first to fourth sidewalls. Also, first capping pattern 118a and a first insulation pattern 120 may be formed between the first preliminary memory cells 117a in the second direction.

The first preliminary memory cell 117a may include a first lower electrode 104b, a first switching element 106b, a first middle electrode 108b, a second lower sacrificial pattern 110b, a first buffer pattern 114b and a first upper electrode 116b. That is, the first preliminary memory cell 117a may be formed to include all elements included in a first memory cell, except for the variable resistance layer.

Also, the second conductive layer 130 may be etched to form a second conductive line 130a. A second preliminary memory cell structure 143 may be formed to extend in the second direction on the second conductive line 130a. The second preliminary memory cell structure 143 may include a second preliminary lower electrode 132a, a second preliminary switching element 134a, a second preliminary middle electrode 136a, a first upper sacrificial pattern 138a, a second preliminary buffer pattern 140a and a second preliminary upper electrode 142a.

Figure 11:
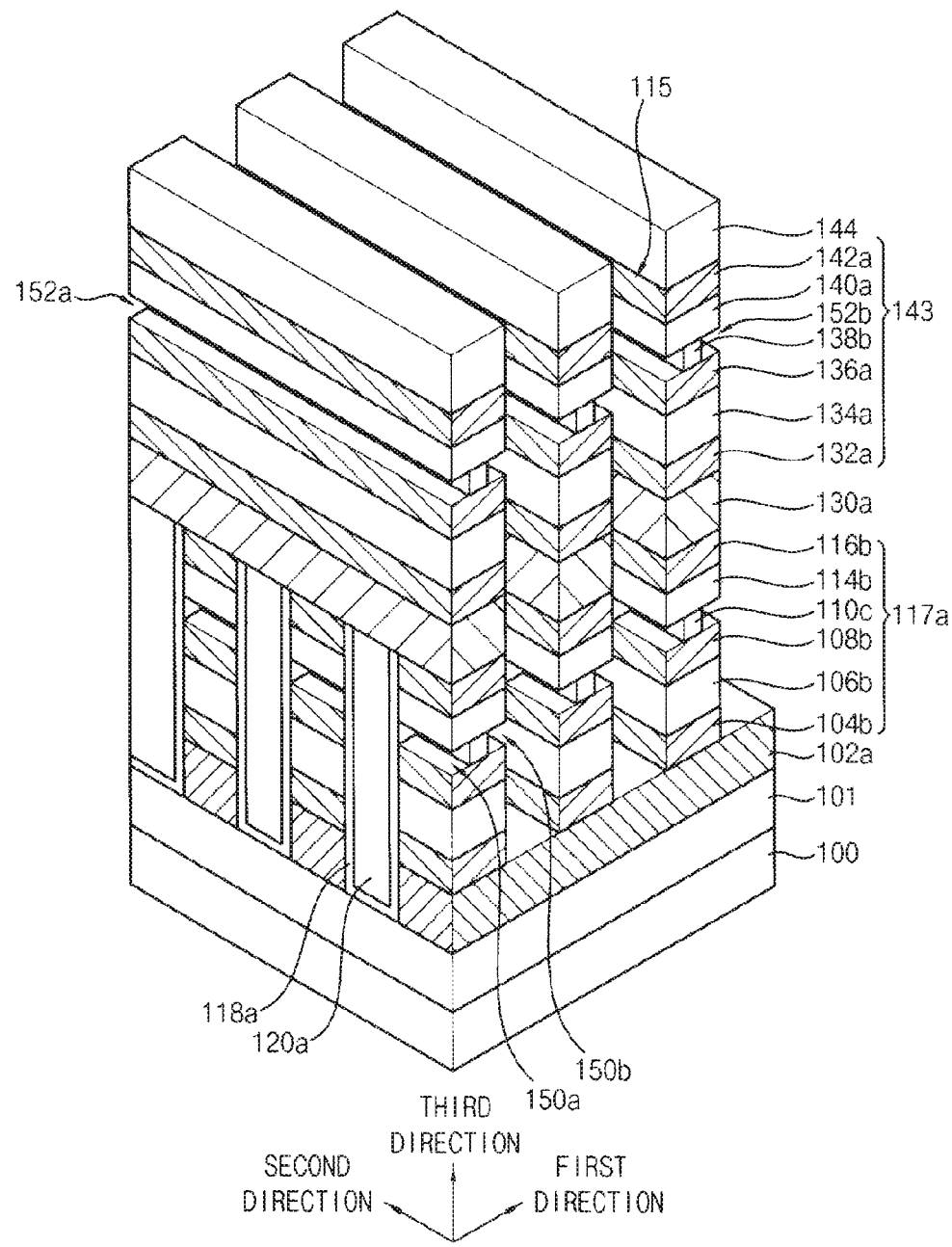

Referring to FIG. 11, both sidewalls of the second lower sacrificial pattern 110b and the first upper sacrificial pattern 138a exposed by the second trench 115 may be partially etched to form a first sacrificial pattern 110c and a second upper sacrificial pattern 138b, respectively. The etching process may include an isotropic etching process.

In the etching process, widths of the first sacrificial pattern 110c and the second upper sacrificial pattern 138b in the first direction may decrease to be less than those of the second lower sacrificial pattern 110b and the first upper sacrificial pattern 138a (refer to FIG. 9), respectively, in the first direction. Thus, first and second recesses 150a and 150b may be formed adjacent to both sidewalls of the first sacrificial pattern 110c, and third and fourth recesses 152a and 152b may be formed adjacent to both sidewalls of the second upper sacrificial pattern 138b.

The first sacrificial pattern 110c may be formed to have a pillar shape. The second upper sacrificial pattern 138b may be formed from the first upper sacrificial pattern 138a (refer to FIG. 9) extending in the second direction, so that the second upper sacrificial pattern 138b may extend in the second direction.

Widths of the first and second recesses 150a and 150b in the first direction may be substantially the same as those of first and second variable resistance patterns 160a and 160b (refer to FIG. 12) subsequently formed, respectively. Accordingly, as the widths of the first and second recesses 150a and 150b may be controlled, the widths of the first and second variable resistance patterns 160a and 160b may be controlled.

Also, widths of the third and fourth recesses 152a and 152b in the first direction may be substantially the same as those of third and fourth variable resistance patterns 161c and 161d (refer to FIG. 14) subsequently formed, respectively. Accordingly, as the widths of the third and fourth recesses 152a and 152b may be controlled, the widths of the third and fourth variable resistance patterns 161c and 161d may be controlled.

The first to fourth recesses 150a, 150b, 152a and 152b may be formed by the same isotropic etching process, so that they may have substantially the same width in the first direction.

Figure 12:
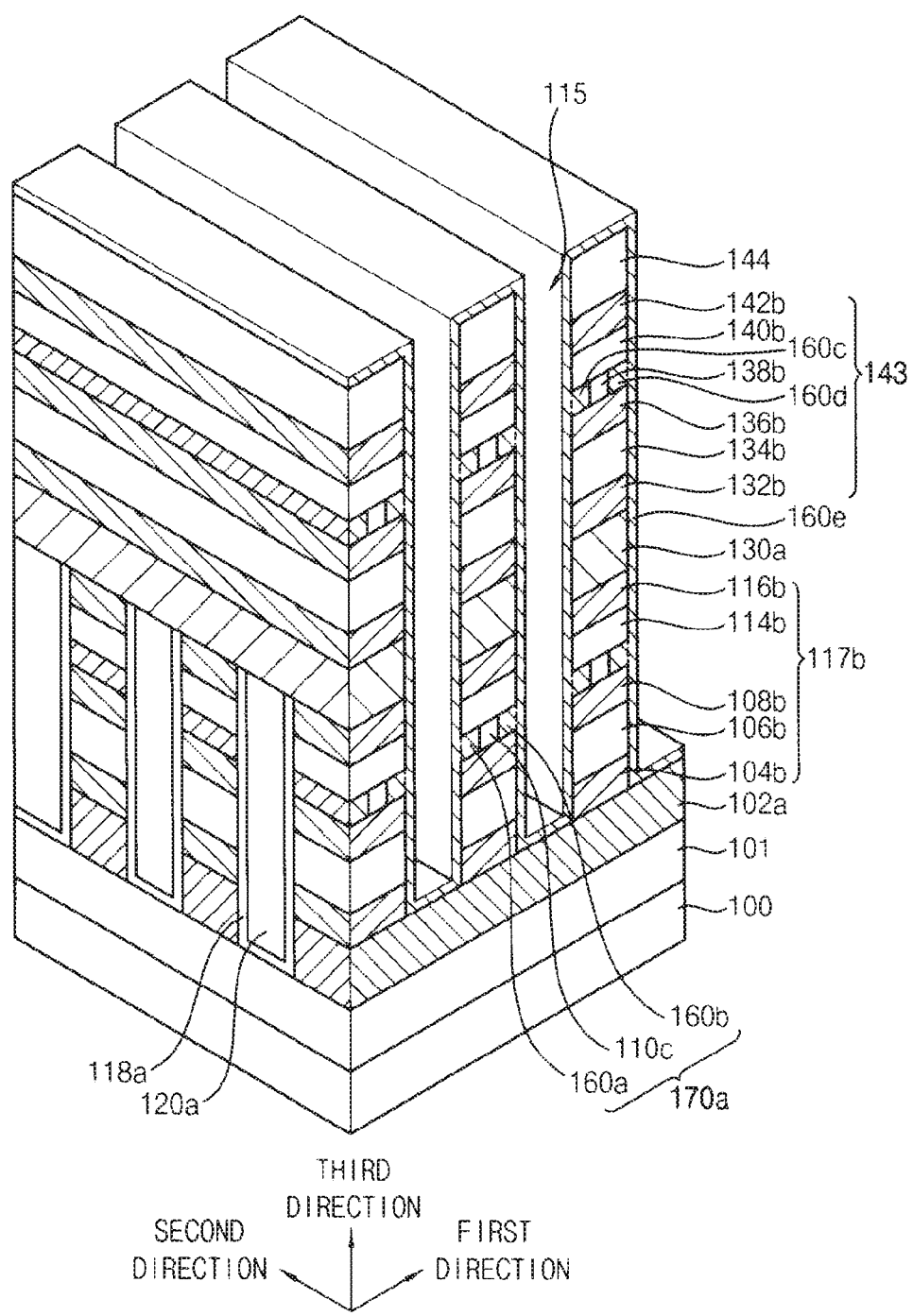

Referring to FIG. 12, a variable resistance layer may be conformally formed on a sidewall and a bottom of the second trench 115 and a surface of the second hard mask 144 to fill the first and fourth recesses 150a, 150b, 152a and 152b.

Particularly, first and second variable resistance patterns 160a and 160b may be formed in the first and second recesses 150a and 150b, respectively, and preliminary third and fourth variable resistance patterns 160c and 160d may be formed in the third and fourth recesses 152a and 152b, respectively. Also, a second capping layer 160e may be formed on the sidewall and the bottom of the second trench 115 and the surface of the second hard mask 144.

The first and second variable resistance patterns 160a and 160b, the third and fourth preliminary variable resistance patterns 160c and 160d, and the second capping layer 160e may be formed by the same deposition process, and thus may include substantially the same material.

As described above, the first memory cell 117b including a first variable resistance structure 170a may be formed on the first conductive line 102a. The first memory cell 117b may include the first lower electrode 104b, the first switching element 106b, the first middle electrode 108b, the first variable resistance structure 170a, the first buffer pattern 114b and the first upper electrode 116b sequentially stacked.

The first variable resistance structure 170a may be formed to include the first variable resistance pattern 160a, the first sacrificial pattern 110c and the second variable resistance pattern 160b. The first variable resistance pattern 160a, the first sacrificial pattern 110c and the second variable resistance pattern 160b may be sequentially disposed in the first direction on substantially the same plane.

Each of the first variable resistance pattern 160a, the first sacrificial pattern 110c and the second variable resistance pattern 160b may have a length in the second direction greater than that in the first direction. The first and second variable resistance patterns 160a and 160b may keep a high resistance state or a low resistance state, so that data may be stored therein.

Each of the third and fourth preliminary variable resistance patterns 160c and 160d may extend in the second direction. The second preliminary memory cell structure 143 may further include the third and fourth preliminary variable resistance patterns 160c and 160d. The second capping layer 160e may serve an insulation layer. In example embodiments, the variable resistance layer may be formed of a transition metal oxide, e.g., titanium oxide, zirconium oxide, aluminum oxide, hafnium oxide, tantalum oxide, niobium oxide, cobalt oxide, tungsten oxide, lanthanum oxide, zinc oxide, etc. These may be used alone or in a combination thereof. In example embodiments, the variable resistance layer may be formed of a perovskite-based material, e.g., STO, BTO, PCMO, etc.

Figure 13:
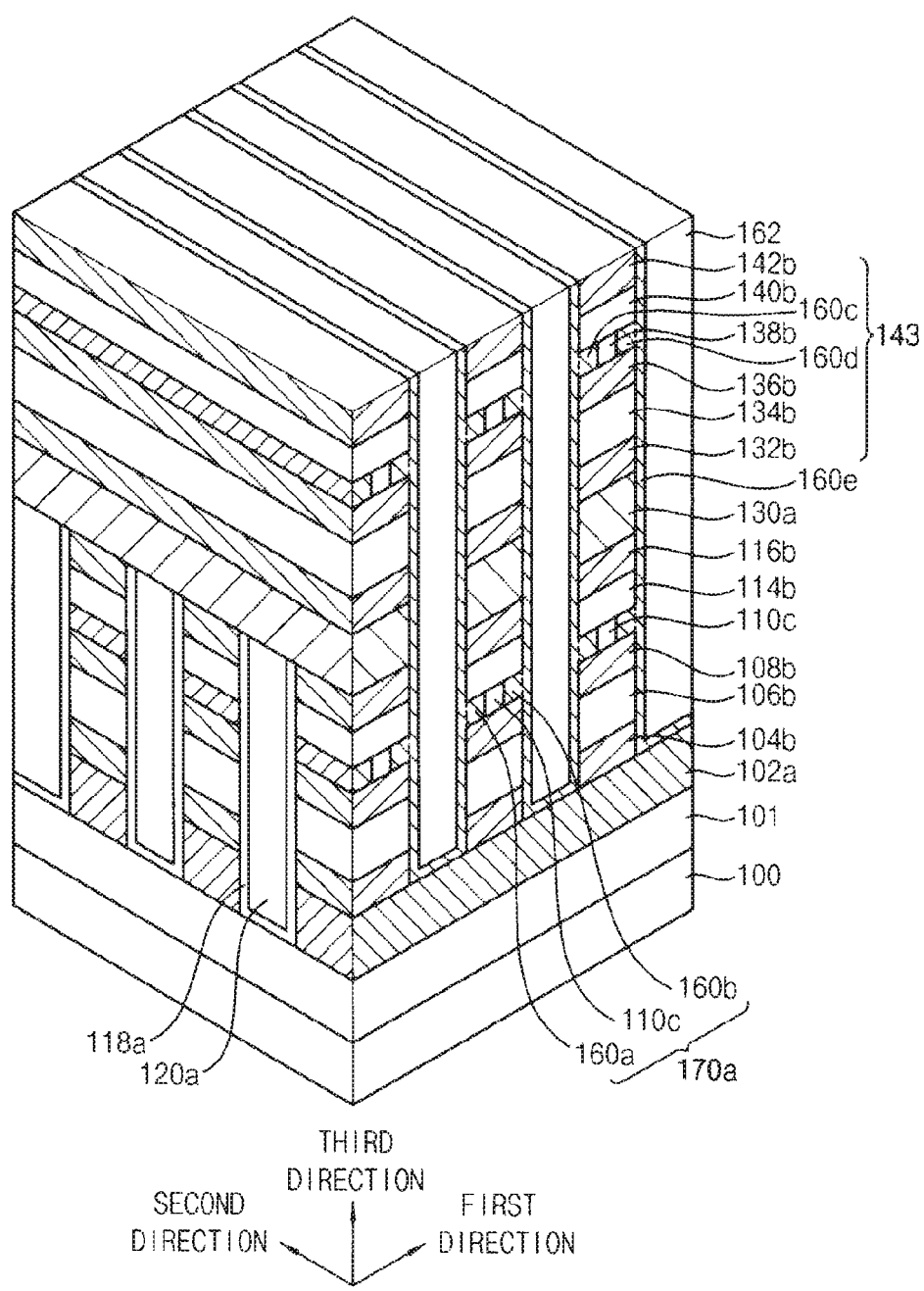

Referring to FIG. 13, a second insulating interlayer 162 may be formed on the second capping layer 160e to fill the second trench 115. The second insulating interlayer 162 may be formed of, e.g., silicon oxide. A width of the second trench 115 may be narrow, and thus the second insulating interlayer 162 may be formed of a material having good gap filling characteristics. In example embodiments, the second insulating interlayer 162 may be formed by depositing a layer including TOSZ, FOX or SOG, and annealing the layer. The annealing process may be performed at a temperature of about 400° C. to about 600° C. for about 0.5 hours to about 2 hours.

During the annealing process, the same heat may be applied to the first and second variable resistance patterns 160a and 160b and the third and fourth preliminary variable resistance patterns 160c and 160d. Thus, the first and second variable resistance patterns 160a and 160b and the third and fourth preliminary variable resistance patterns 160c and 160d may have substantially the same electrical property.

Upper portions of the second capping layer 160e and the second insulating interlayer 162 may be planarized until a top surface of the second upper electrode 142b may be exposed. In the planarization process, the second hard mask 144 may be also removed. In example embodiments, the planarization process may be performed by a CMP process and/or an etch back process.

Figure 14:
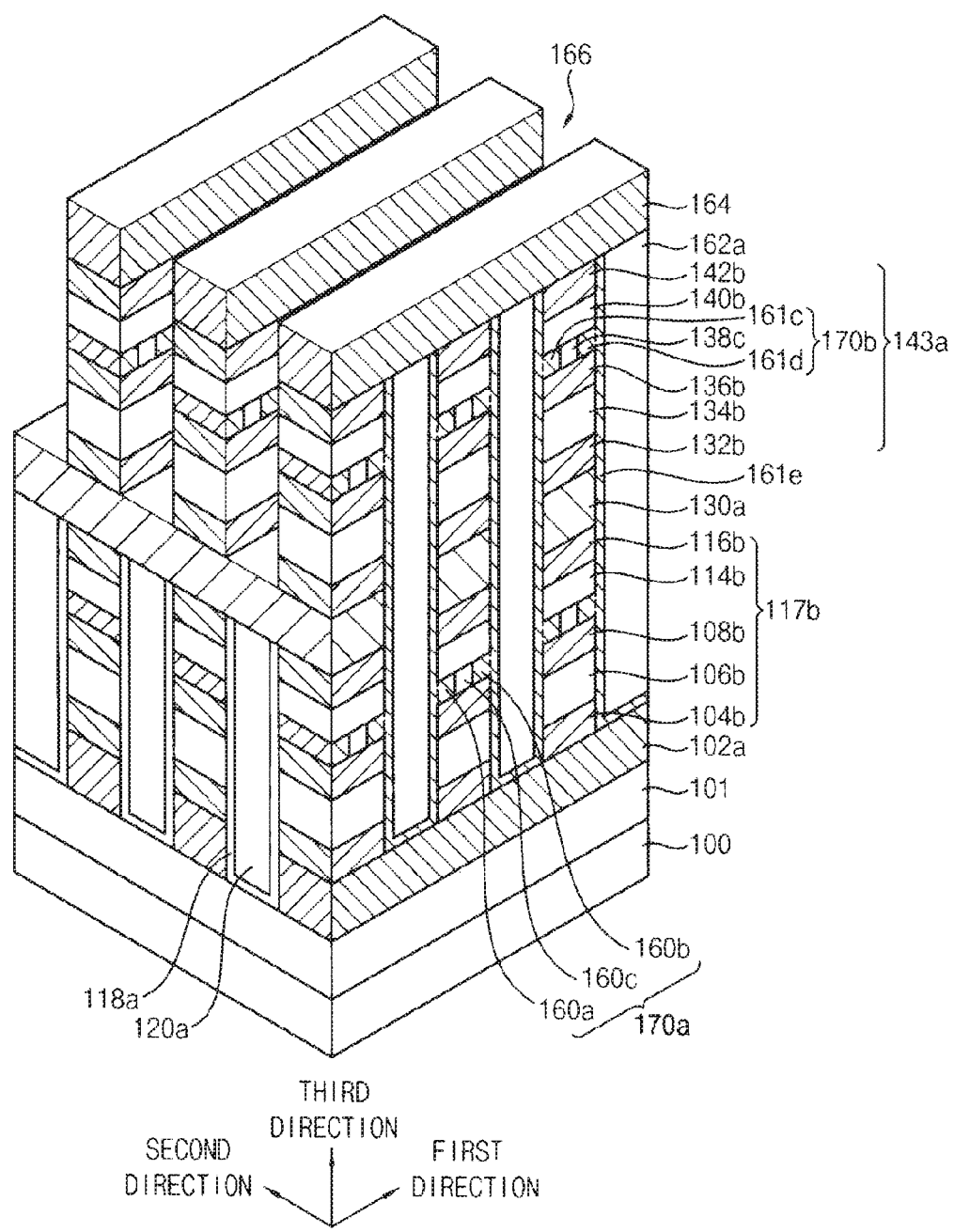

Referring to FIG. 14, a third conductive layer may be formed on the second insulating interlayer 162, the second capping layer 160e and the second preliminary memory cell structure 143. A third hard mask (not shown) may be formed to extend in the first direction on the third conductive layer. The third hard mask may be formed to overlap the first conductive line 102a.

The second preliminary memory cell structure 143, the second capping layer 160e and the second insulating interlayer 162 may be etched using an third hard mask as an etching mask to form a third trench 166 exposing the second conductive line 130a.

By the process, the third conductive layer may be etched to form a third conductive line 164. The second preliminary memory cell structure 143 may be etched in the first direction to form a second memory cell 143a having a pillar shape including first to fourth sidewalls on the second conductive line 130a. Also, the second insulating interlayer 162 and the second capping layer 160e may be etched to form a second insulation pattern 162a and second capping pattern 161e, respectively.

The second memory cell 143a may include a second lower electrode 132b, a second switching element 134b, a second middle electrode 136b, a second variable resistance structure 170b, a second buffer pattern 140b and a second upper electrode sequentially stacked.

The second variable resistance structure 170b may include a third variable resistance pattern 161c, a second sacrificial pattern 138c and a fourth variable resistance pattern 161d, and may extend in the second direction. The third variable resistance pattern 161c, the second sacrificial pattern 138c and the fourth variable resistance pattern 161d may be sequentially stacked in the first direction. The third and fourth variable resistance patterns 161c and 161d of the second memory cell may keep a high resistance state or a low resistance state, so that data may be stored therein.

Figure 15:
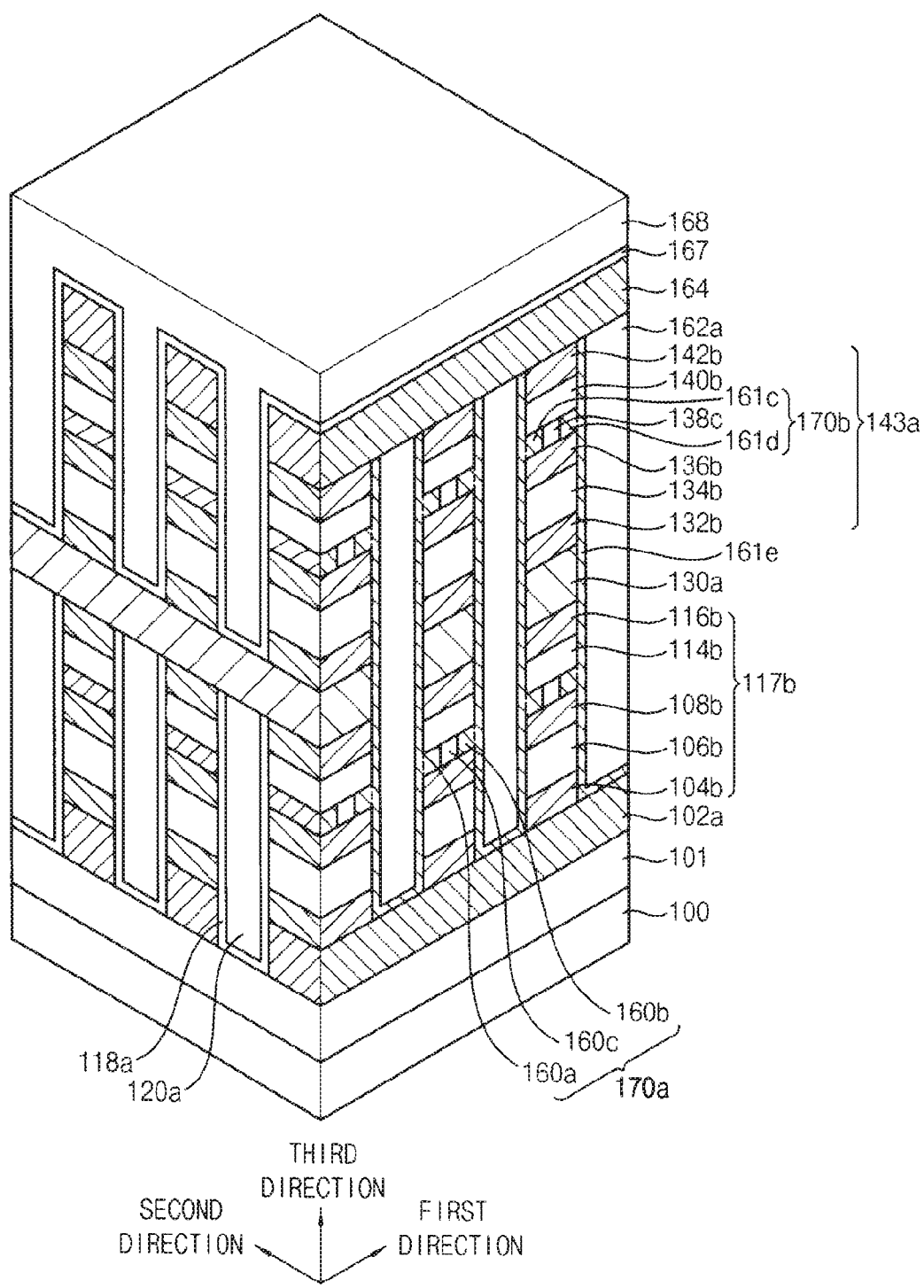

Referring to FIG. 15, a third capping layer 167 and a third insulating interlayer 168 may be formed in the third trench 166. Particularly, the third capping layer 167 may be conformally formed on an inner wall of the third trench 166 and surface of the third conductive line 164. The third capping layer 167 may be formed of, e.g., silicon nitride.

The third insulating interlayer 168 may be formed on the third capping layer 167 to fill the third trench 166. The third insulating interlayer 168 may be formed of, e.g., silicon oxide. As a width of the third trench 166 may be narrow, the third insulating interlayer 168 may be formed of a material having good gap filling characteristics. In example embodiments, the third insulating interlayer 168 may be formed by depositing a layer including TOSZ, FOX or SOG, and annealing the layer. The annealing process may be performed at a temperature of about 400° C. to about 600° C. for about 0.5 hours to about 2 hours.

During the annealing process, the same heat may be applied to the first to fourth variable resistance patterns 160a, 160b, 161c and 161d. Thus, the first to fourth variable resistance patterns 160a, 160b, 161c and 161d may have substantially the same electrical property.

As described above, in the variable resistance memory device, the first to fourth variable resistance patterns 160a, 160b, 161c and 161d may be formed after forming other elements of first and second memory cells. Thus, the first to fourth variable resistance patterns 160a, 160b, 161c and 161d may not be degraded by a deposition process, annealing process, doping process, etc., for forming the first and second memory cells. Also, the annealing process may be performed at the same times to the first to fourth variable resistance patterns 160a, 160b, 161c and 161d, so that the first to fourth variable resistance patterns 160a, 160b, 161c and 161d may have substantially the same electrical property. Thus, an electrical variation of the first and second memory cells in the variable resistance memory device may decrease.

Figure 16:
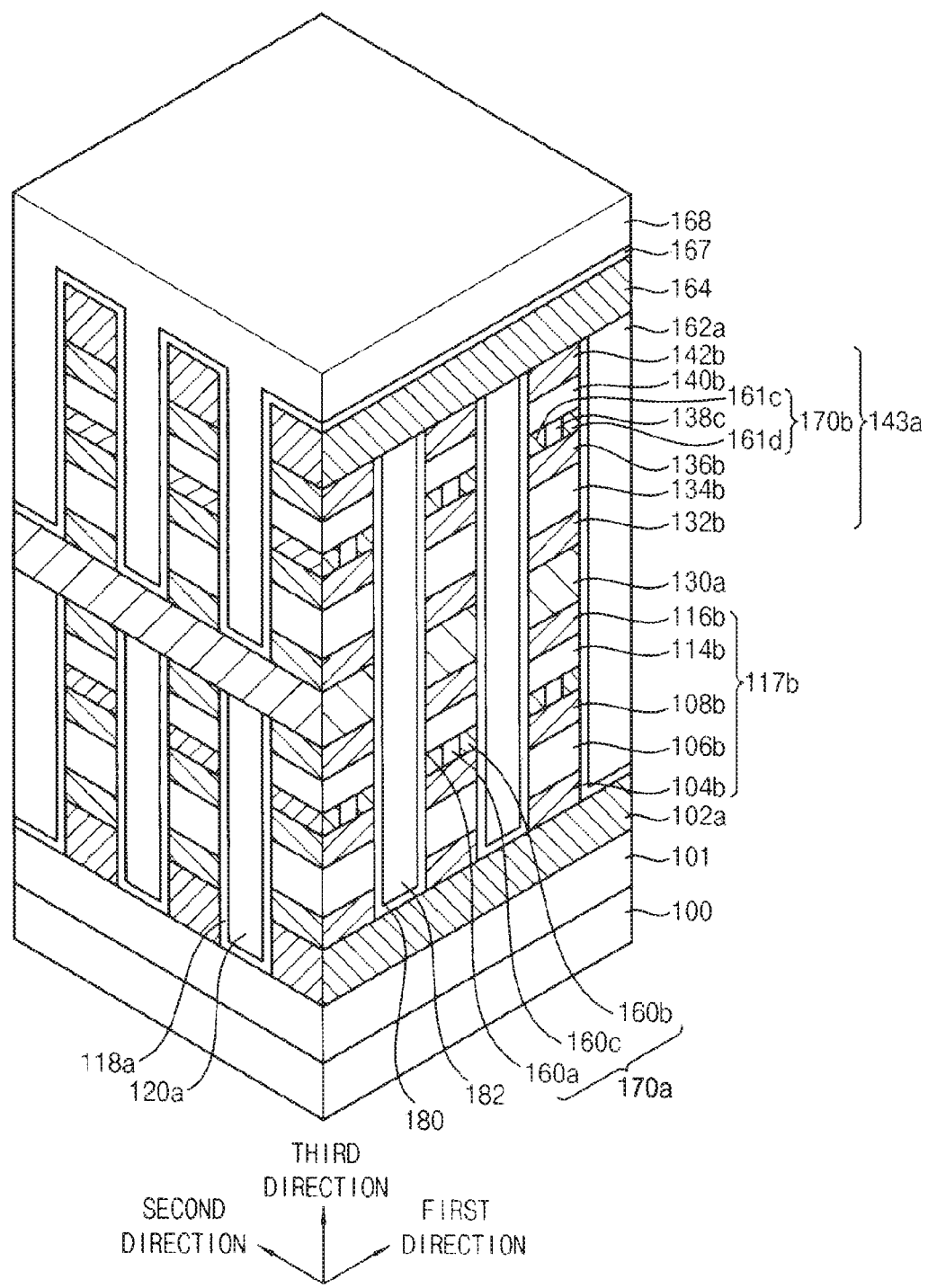

FIG. 16 is a perspective view illustrating a variable resistance memory device in accordance with example embodiments. The variable resistance memory device shown in FIG. 16 may be substantially the same as or similar to the variable resistance memory device illustrated with reference to FIGS. 1 to 3, except for a material of the second capping pattern. Thus, like reference numerals refer to like elements, and detailed descriptions thereon are omitted herein.

Referring to FIG. 16, the variable resistance memory device may include an insulation layer 101, a first conductive line 102a, a second conductive line 130a, a first memory cell 117b, a second memory cell 143a and a third conductive line 164. The insulation layer 101 may be formed on a substrate 100.

A first capping pattern 118a may be conformally formed on the second and fourth sidewalls of the first memory cell 117b, a sidewall of the first conductive line 102a and a top surface of the insulation layer 101. Also, a third capping layer 167 may be conformally formed on the second and fourth sidewalls of the second memory cell 143a, a sidewall of the second conductive line 130a and a sidewall and a top surface of the third conductive line 164. Each of the first capping pattern 118a and the third capping layer may include, e.g., silicon nitride, silicon oxynitride, etc.

A second capping pattern 180 may be conformally formed on the first and third sidewalls of the first and second memory cells 117b and 143a, a sidewall of the second conductive line 130a and a top surface of the first conductive line 102a.

The second capping pattern 180 may have an insulating material different from those of the first to fourth variable resistance patterns 160a, 160b, 161c and 161d. In example embodiments, the second capping pattern 180 may have a material substantially the same as those of the first capping pattern 118a and the third capping layer 167. The second capping pattern 180 may include, e.g., silicon nitride, silicon oxynitride, etc.

Figure 17:
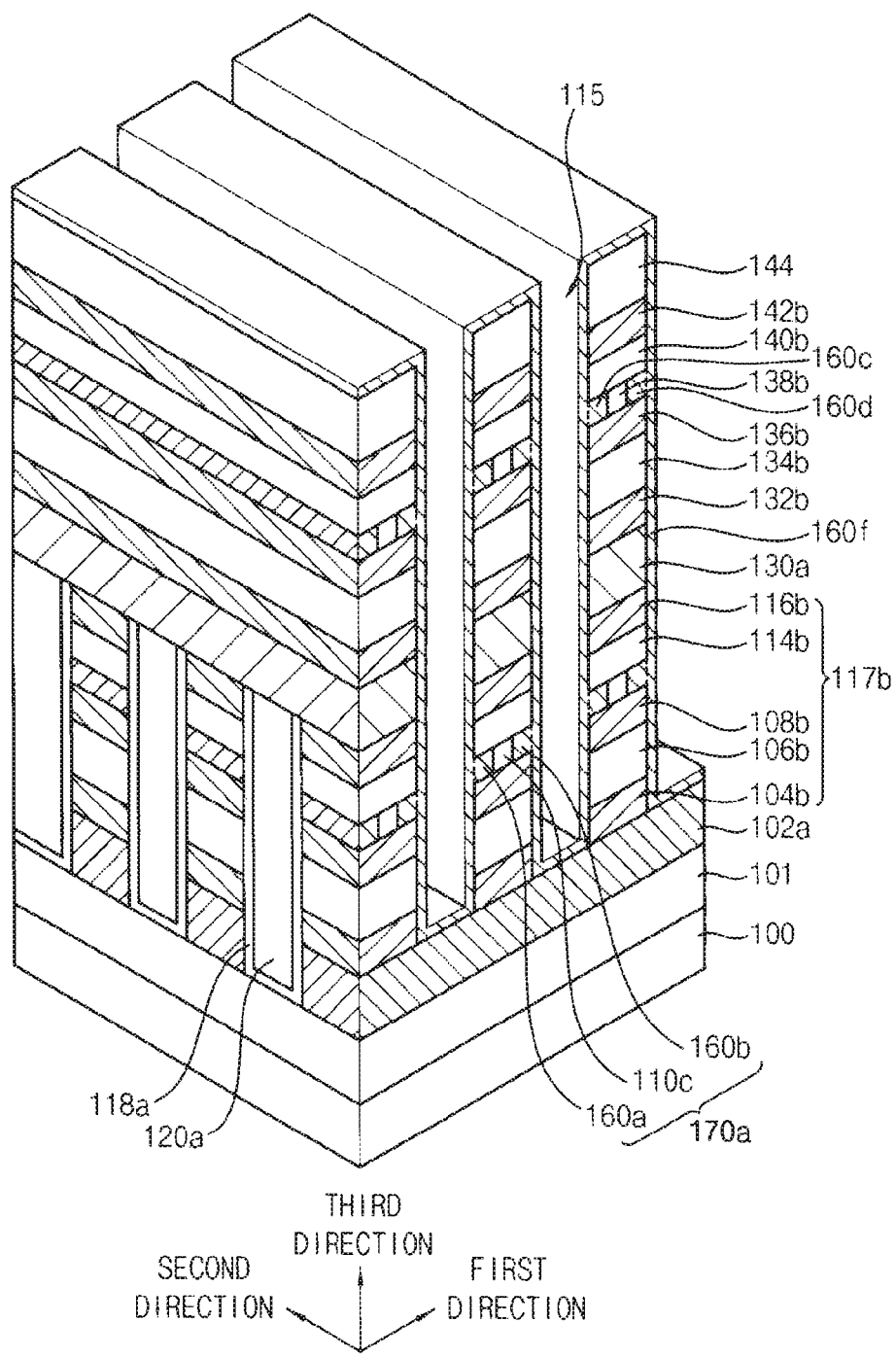
Figure 18:
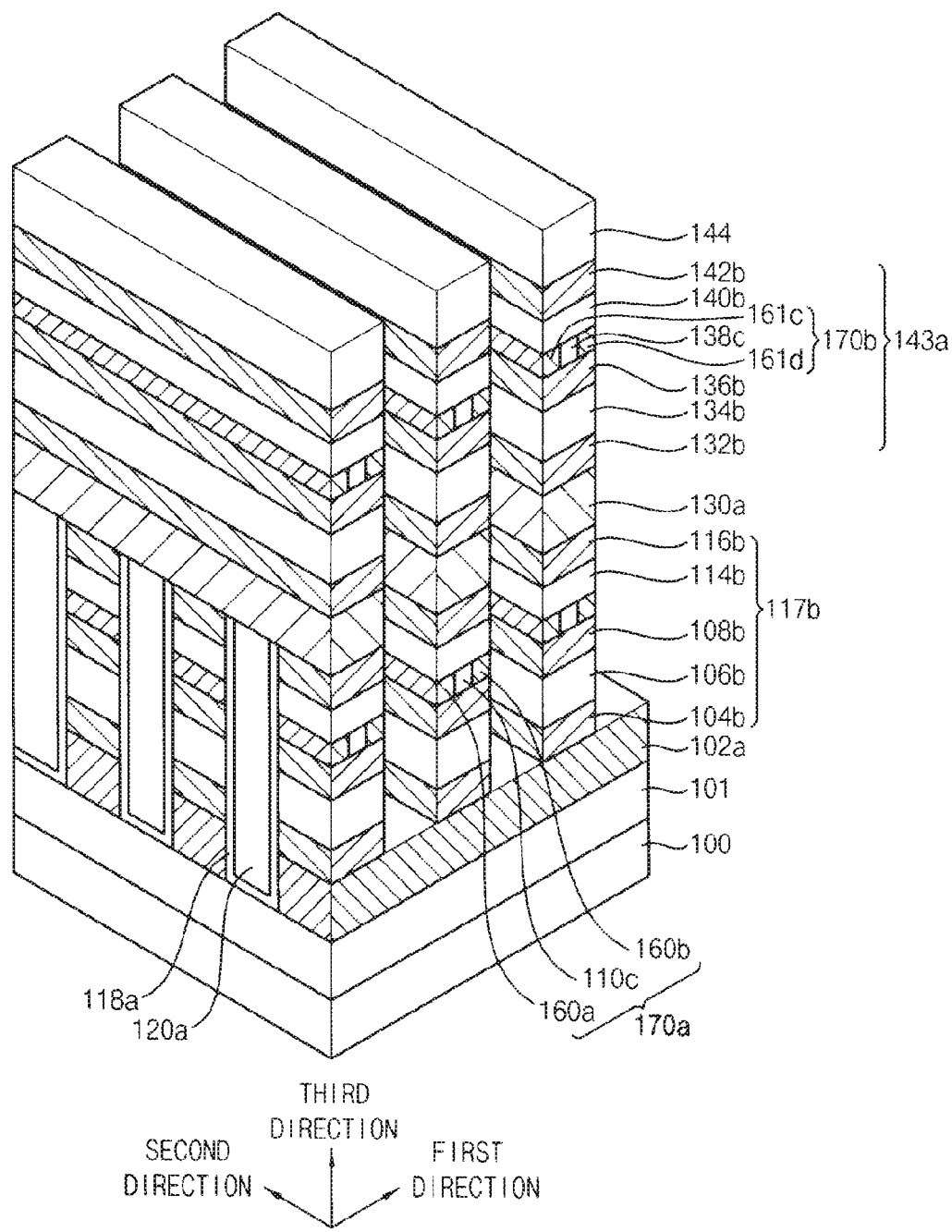
Figure 19:
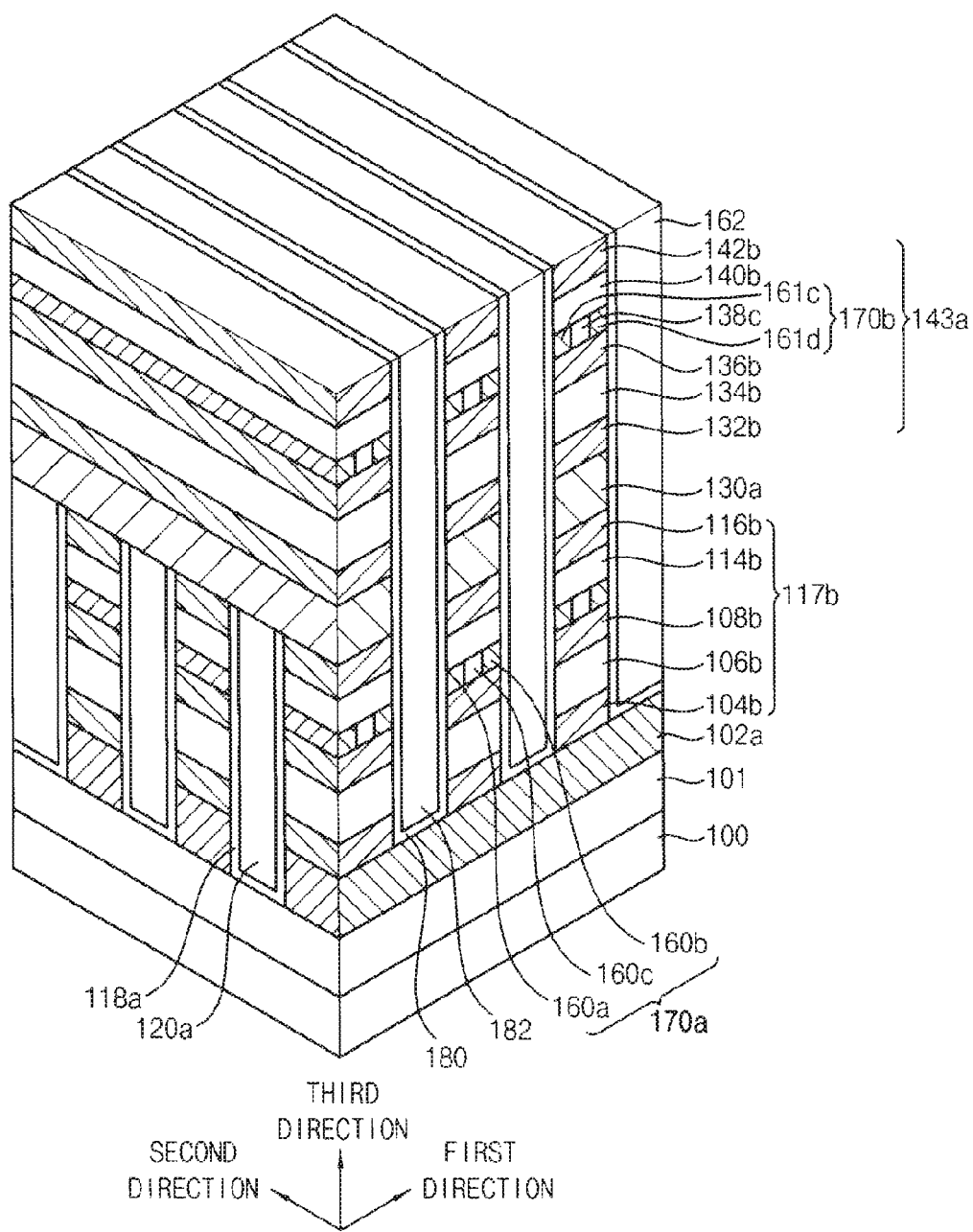

FIGS. 17 to 19 are perspective views illustrating stages of a method of manufacturing a variable resistance memory device in accordance with example embodiments.

First, a structure shown in FIG. 11 may be formed by processes substantially the same as or similar to those illustrated with reference to FIGS. 4 to 11.

Referring to FIG. 17, a variable resistance layer may be conformally formed on a sidewall and a bottom of the second trench 115 and a surface of the second hard mask 144 to fill the first and fourth recesses 150*a*, 150*b*, 152*a* and 152*b*.

Particularly, first and second variable resistance patterns 160*a* and 160*b* may be formed in the first and second recesses 150*a* and 150*b*, respectively, and preliminary third and fourth variable resistance patterns 160*c* and 160*d* may be formed in the third and fourth recesses 152*a* and 152*b*, respectively. Also, a sacrificial capping layer 160*f* may be formed on the sidewall and the bottom of the second trench 115 and the surface of the second hard mask 144.

As described above, the first memory cell 117*b* including a first variable resistance structure 170*a* may be formed on the first conductive line 102*a*. The first memory cell 117*b* may include the first lower electrode 104*b*, the first switching element 106*b*, the first middle electrode 108*b*, the first variable resistance structure 170*a*, the first buffer pattern 114*b* and the first upper electrode 116*b* sequentially stacked.

In example embodiments, the variable resistance layer may be formed of a transition metal oxide, e.g., titanium oxide, zirconium oxide, aluminum oxide, hafnium oxide, tantalum oxide, niobium oxide, cobalt oxide, tungsten oxide, lanthanum oxide, zinc oxide, etc. These may be used alone or in a combination thereof. In example embodiments, the variable resistance layer may be formed of a perovskite-based material, e.g., STO, BTO, PCMO, etc.

In an example embodiment, the variable resistance memory device may be a PRAM device, and thus the variable resistance layer may include a material of which a resistance may be changed by a phase change or a phase transition. In this case, the variable resistance layer may be formed to include a chalcogenide-based material in which germanium (Ge), antimony (Sb) and/or tellurium (Te) are combined by a given ratio.

In example embodiments, the variable resistance memory device may be an MRAM device, and thus the variable resistance layer may include a material of which a resistance may be changed by a magnetic field or a spin transfer torque (STT). In this case, the variable resistance layer may be formed to include a ferromagnetic material, e.g., iron (Fe), nickel (Ni), cobalt (Co), dysprosium (Dy), gadolinium (Gd), etc.

Referring to FIG. 18, the sacrificial capping layer 160*f* on the side and the bottom of the second trench 115 and the surface of the second hard mask 144 may be selectively etched, so that sidewalls of the first and second variable resistance patterns 160*a* and 160*b* and the third and fourth preliminary variable resistance patterns 161*c* and 161*d* may be exposed by the second trench 115.

Referring to FIG. 19, a second capping layer 180 may be conformally formed on the on the sidewall and the bottom of the second trench 115 and the surface of the second hard mask 144. In example embodiments, the second capping layer 180 may be formed of a material substantially the same as that of the first capping pattern 118*a*. The second capping layer 180 may be formed of, e.g., silicon nitride, silicon oxynitride, etc.

A second insulating interlayer 162 may be formed on the second capping layer 180 to fill the second trench 115.

Upper portions of the second capping layer 180 and the second insulating interlayer 162 may be planarized until a top surface of the second upper electrode 142*b* may be exposed. In the planarization process, the second hard mask 144 may be also removed. In example embodiments, the planarization process may be performed by a CMP process and/or an etch back process.

Then, processes substantially the same as or similar to those illustrated with reference to FIGS. 14 to 15 may be performed to form the variable resistance memory device illustrated with reference to FIG. 16.

Figure 20:
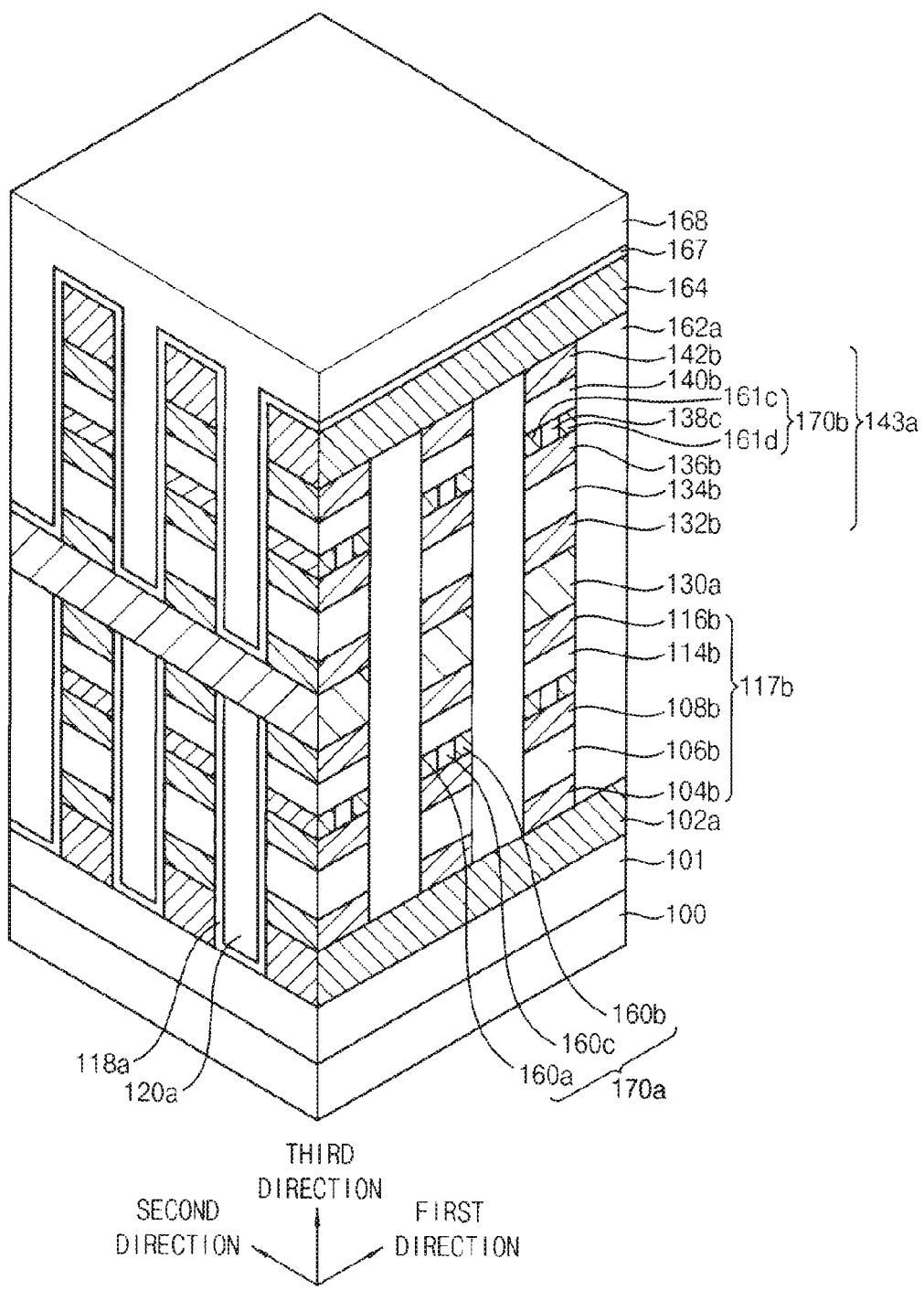

FIG. 20 is a perspective view illustrating a variable resistance memory device in accordance with example embodiments. The variable resistance memory device shown in FIG. 20 may be substantially the same as or similar to the variable resistance memory device illustrated with reference to FIG. 1, except for no second capping pattern. Thus, like reference numerals refer to like elements, and detailed descriptions thereon are omitted herein.

Figure 21:
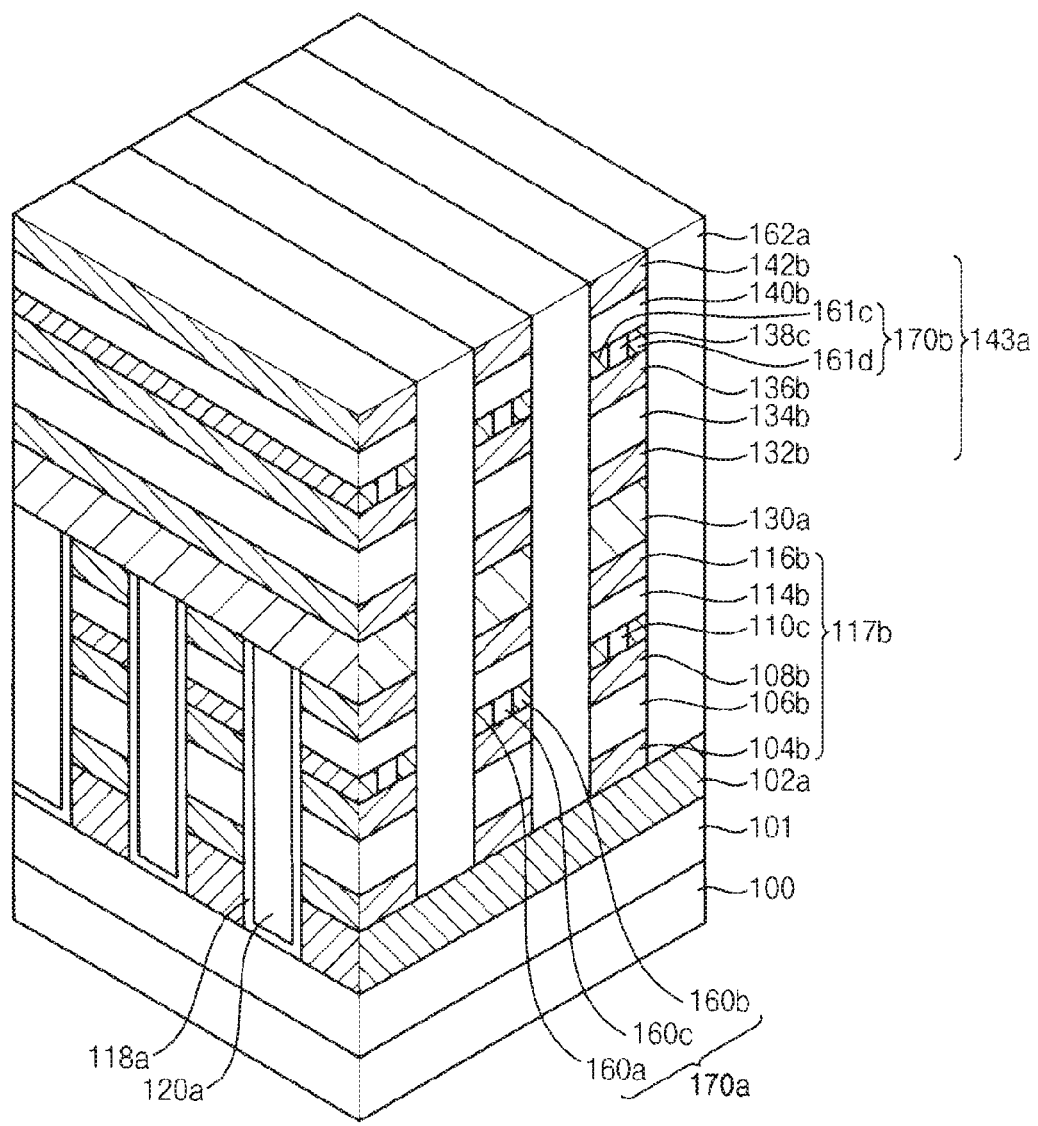

FIG. 21 is a perspective view illustrating a stage of a method of manufacturing a variable resistance memory device in accordance with example embodiments.

First, a structure shown in FIG. 11 may be formed by processes substantially the same as or similar to those illustrated with reference to FIGS. 4 to 11. Then, processes substantially the same as or similar to those illustrated with reference to FIGS. 17 and 18 may be performed. Thus, the sacrificial capping layer 160*f* on the side and the bottom of the second trench 115 and the surface of the second hard mask 144 may be selectively etched.

Referring to FIG. 21, a second insulating interlayer 162 may be formed to fill the second trench 115. Upper portions of the second insulating interlayer 162 may be planarized until a top surface of the second upper electrode 142*b* may be exposed. In the planarization process, the second hard mask 144 may be also removed. In example embodiments, the planarization process may be performed by a CMP process and/or an etch back process.

Then, processes substantially the same as or similar to those illustrated with reference to FIGS. 14 to 15 may be performed to form the variable resistance memory device illustrated with reference to FIG. 20.

According to example embodiments, a variable resistance structure included in each of the first and second memory cells may have a sacrificial pattern and the variable resistance patterns on both sides of the sacrificial pattern. The variable resistance patterns included in the first and second memory cells may be formed by a same deposition process. Also, the variable resistance patterns may be formed after annealing processes for forming the first and second memory cells. When the annealing processes are performed, the variable resistance patterns included in the first and second memory cells may not be degraded, and thus may have a uniform electrical characteristic. Accordingly, the variable resistance memory device may have desired electrical characteristics.

Figure 22:
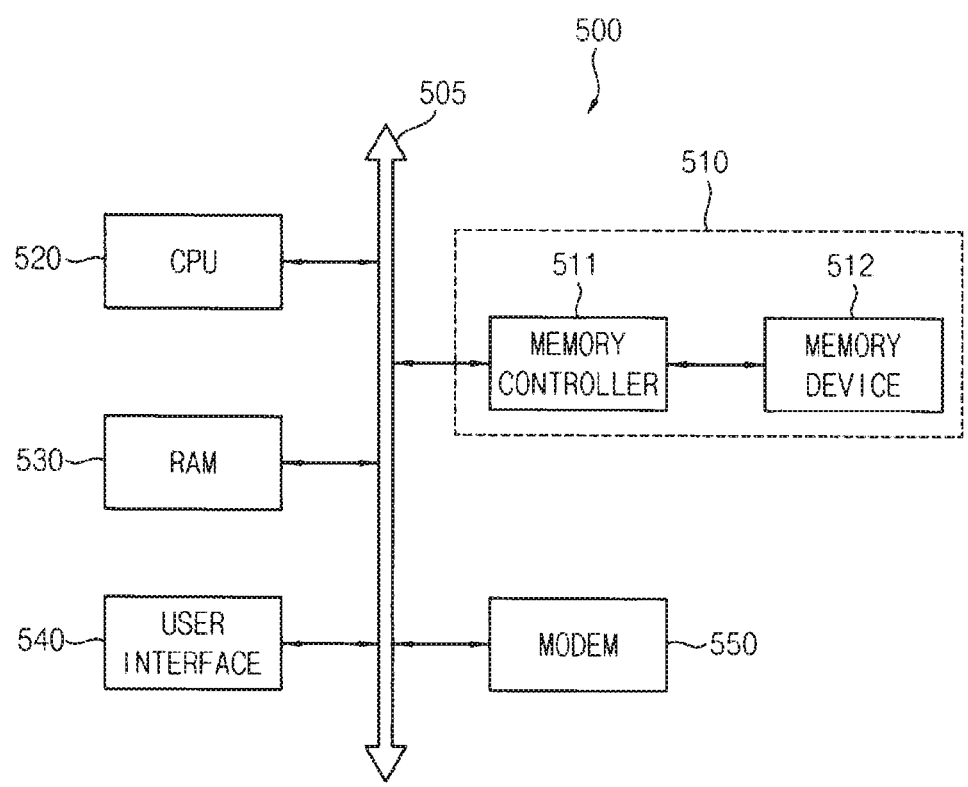

FIG. 22 is a block diagram illustrating a data processing system in accordance with example embodiments.

Referring to FIG. 22, a data processing system 500 may include a CPU 520 electrically connected to a RAM 530, a user interface 540, a modem 550, such as a baseband chipset, and a memory system 510 via a system bus 505. The memory system 510 may include a memory device 512 and a memory controller 511. The memory device 512 may include a variable resistance memory device in accordance with the example embodiments. Thus, input data of a high capacity or input data from the CPU may be stored in the memory device 512. The memory controller 511 may control an operation of the memory device 510. The memory system 500 including the memory device 510 and the memory controller 511 may serve as a memory card or a solid state disk (SSD). When the data processing system 500 is a mobile device, a battery of the mobile device may be provided to supply an operating voltage of the data processing system 500. The data processing system 500 in accordance with the example embodiments may further include an application chipset, a camera image processor (CIS), a mobile DRAM, etc. The data processing system 500 may be applied to electric devices, e.g., a mobile phone, a MP player, etc.

The variable resistance memory device and the method of manufacturing the same may be applied in various types of memory device, e.g., ReRAM device, PRAM device, MRAM device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable resistance memory device comprising:
a plurality of first conductive lines on a substrate, each of the first conductive lines extending in a first direction;
a plurality of second conductive lines above the first conductive lines, each of the second conductive lines extending in a second direction transverse to the first direction;
a plurality of first memory cells at intersections where the first and second conductive lines overlap each other, each of the first memory cells including a first variable resistance structure having a first variable resistance pattern, a first sacrificial pattern and a second variable resistance pattern sequentially stacked in the first direction on substantially a first plane;
a plurality of third conductive lines above the second conductive lines, each of the third conductive lines extending in the first direction;
a plurality of second memory cells at intersections where the second and the third conductive lines overlap each other, each of the second memory cells including a second variable resistance structure having a third variable resistance pattern, a second sacrificial pattern and a fourth variable resistance pattern sequentially stacked in the first direction on substantially a second plane; and
a first capping pattern on first and second sidewalls facing in the first direction of each of the first and second memory cells.

2. The variable resistance memory device of claim 1, wherein the first memory cell includes a first lower electrode, a first switching element, the first variable resistance structure and a first upper electrode sequentially stacked on the first conductive line, and the second memory cell includes a second lower electrode, a second switching element, the second variable resistance structure and a second upper electrode sequentially stacked on the second conductive line.

3. The variable resistance memory device of claim 1, wherein the first to fourth variable resistance patterns comprise the same transition metal oxide.

4. The variable resistance memory device of claim 3, wherein the first to fourth variable resistance patterns comprise at least one of titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), and zinc oxide (ZnOx).

5. The variable resistance memory device of claim 3, further comprising a first buffer pattern on the first variable resistance structure and a second buffer pattern on the second variable resistance structure, wherein the first buffer pattern absorbs oxygen from the first and second variable resistance patterns or supplies oxygen thereto, and the second buffer pattern absorbs oxygen from third and fourth variable resistance patterns or supplies oxygen thereto.

6. The variable resistance memory device of claim 1, wherein the first capping pattern comprises the same material as a material of the first to fourth variable resistance patterns.

7. The variable resistance memory device of claim 1, further comprising a second capping pattern and a third capping layer wherein the second capping pattern is formed on third and fourth sidewalls facing in the second direction of the first memory cell, and the third capping layer is formed on the third and fourth sidewalls facing in the second direction of the second memory cell.

8. The variable resistance memory device of claim 7, wherein each of the second capping pattern and the third capping layer comprises a material different from a material of the first capping pattern.

9. The variable resistance memory device of claim 1, wherein the first and second sacrificial patterns comprise an insulating material.

10. The variable resistance memory device of claim 1, further comprising a first insulation pattern filling a gap between structures disposed in the second direction, each of the structures including the first conductive line and the first memory cell sequentially stacked in the second direction, and a second insulation pattern filling a gap between structures disposed in the first direction, each of the structures including the first memory cell, the second conductive line and the second memory cell sequentially stacked.

11. A resistance memory device comprising:
a first electrode;
a switching element on the first electrode;
a variable resistance structure on the switching element, the variable resistance structure including a first resistance pattern and a second resistance pattern which are horizontally spaced apart from each other;
a second electrode on the variable resistance structure; and
a capping layer on sidewalls of the switching element and the first and second resistance patterns; wherein the capping layer is the same material as a material of the first and second resistance patterns.

12. The variable resistance memory device of claim 11, wherein the variable resistance structure further comprises an insulating pattern between the first resistance pattern and the second resistance pattern, and the first resistance pattern and the second resistance pattern are separated by the insulating pattern.

13. The variable resistance memory device of claim 11, wherein the first and second resistance patterns are spaced apart from each other in a first direction, and a width in the first direction of each of the first and second resistance patterns is less than a width in a second direction transverse to the first direction.

14. The variable resistance memory device of claim 11, wherein the first and second resistance patterns comprise one of a transition metal oxide and a perovskite-based material.

15. A variable resistance memory device comprising:
a plurality of first conductive lines on an insulation layer of a substrate, each of the first conductive lines extending in a first direction;
a plurality of second conductive lines above the first conductive lines, each of the second conductive lines extending in a second direction transverse to the first direction;
a plurality of first memory cells at intersections where the first and second conductive lines overlap each other, each of the first memory cells including a first variable resistance structure having variable resistance patterns stacked in the first direction on a first plane;
a plurality of third conductive lines above the second conductive lines, each of the third conductive lines extending in the first direction;
a plurality of second memory cells at intersections where the second and the third conductive lines overlap each other, each of the second memory cells including a second variable resistance structure having variable resistance patterns stacked in the first direction on a second plane; and
a first capping pattern on first and second sidewalls facing in the first direction of each of the first and second memory cells.

16. The variable resistance memory device of claim 15, wherein the first memory cell includes a first lower electrode, a first switching element, the first variable resistance structure and a first upper electrode stacked on the first conductive line, and the second memory cell includes a second lower electrode, a second switching element, the second variable resistance structure and a second upper electrode stacked on the second conductive line.

17. The variable resistance memory device of claim 16, further comprising a first buffer pattern on the first variable resistance structure and a second buffer pattern on the second variable resistance structure, wherein the first buffer pattern exchanges oxygen with the corresponding variable resistance patterns, and the second buffer pattern exchanges oxygen with the corresponding variable resistance patterns.

18. The variable resistance memory device of claim 15, wherein the first and second variable resistance structures have insulating material between the variable resistance patterns.

* * * * *